(12) United States Patent
Izuno et al.

(10) Patent No.: US 7,301,175 B2
(45) Date of Patent: Nov. 27, 2007

(54) LIGHT EMITTING APPARATUS AND METHOD OF MANUFACTURING THE SAME

(75) Inventors: Kunihiro Izuno, Anan (JP); Kouki Matsumoto, Anan (JP); Shinichi Nagahama, Tokushima (JP); Masahiko Sano, Tokushima (JP); Tomoya Yanamoto, Anan (JP); Keiji Sakamoto, Anan (JP)

(73) Assignee: Nichia Corporation, Tokushima (JP)

( * ) Notice: Subject to any disclaimer, the term of this patent is extended or adjusted under 35 U.S.C. 154(b) by 181 days.

(21) Appl. No.: 10/673,273

(22) Filed: Sep. 30, 2003

(65) Prior Publication Data

US 2004/0061433 A1    Apr. 1, 2004

(30) Foreign Application Priority Data

Oct. 12, 2001 (JP) ............................. 2001-315391
Nov. 2, 2001 (JP) ............................. 2001-338462
Jan. 28, 2002 (JP) ............................. 2002-019191
Jul. 8, 2002 (JP) ............................. 2002-198761
Oct. 11, 2002 (JP) ..................... PCT/JP02/10587

(51) Int. Cl.
    *H01L 33/00* (2006.01)

(52) U.S. Cl. .................... 257/98; 257/99; 257/100; 257/E33.061

(58) Field of Classification Search ................ 257/95, 257/96, 97, 98–100, 40, 103, E33.059, E33.061; 313/696, 697, 691
See application file for complete search history.

(56) References Cited

U.S. PATENT DOCUMENTS

| 5,376,580 A | 12/1994 | Kish et al. |
| 5,502,316 A | 3/1996 | Kish et al. |
| 5,599,403 A | 2/1997 | Kariya et al. |
| 5,684,309 A | 11/1997 | McIntosh et al. |
| 5,739,554 A | 4/1998 | Edmond et al. |
| 5,851,905 A | 12/1998 | McIntosh et al. |

(Continued)

FOREIGN PATENT DOCUMENTS

EP    0854523 A2    7/1998

(Continued)

OTHER PUBLICATIONS

Daisuke Morita et al. (2002) "High Output Power 365 nm Ultraviolet Light Emitting Diode of GaN-Free Structure," Jpn J. Appl. Phys. vol. 41 pp. 1434-1436.

(Continued)

*Primary Examiner*—Minh-Loan Tran
(74) *Attorney, Agent, or Firm*—Morrison & Foerster, LLP

(57) ABSTRACT

A light emitting apparatus comprising a light emitting device (101) disposed on a supporting body (105), and coating layers ((108, 109) that bind a fluorescent substance that absorbs light emitted by the light emitting device (101) and emits light of a different wavelength and secures the fluorescent substance onto the surface of the light emitting device (101). The coating layers (108, 109) are made of an inorganic material including an oxide and a hydroxide, each containing at least one element selected from the group consisting of Si, Al, Ga, Ti, Ge, P, B, Zr, Y, Sn, Pb and alkali earth metals. Also an adhesive layer (110) is made of the same inorganic material as that of the coating layers (108, 109).

13 Claims, 9 Drawing Sheets

U.S. PATENT DOCUMENTS

| | | | |
|---|---|---|---|
| 5,909,081 A * | 6/1999 | Eida et al. | 313/504 |
| 5,959,316 A | 9/1999 | Lowery | |
| 6,066,861 A | 5/2000 | Höhn et al. | |
| 6,120,600 A | 9/2000 | Edmond et al. | |
| 6,281,032 B1 | 8/2001 | Matsuda et al. | |
| 6,319,425 B1 | 11/2001 | Tasaki et al. | |
| 6,328,796 B1 | 12/2001 | Kub et al. | |
| 6,409,938 B1 * | 6/2002 | Comanzo | 252/301.4 R |
| 6,455,340 B1 | 9/2002 | Chua et al. | |
| 6,495,862 B1 | 12/2002 | Okazaki et al. | |
| 6,661,030 B2 * | 12/2003 | Komoto et al. | 257/98 |
| 6,669,866 B1 | 12/2003 | Kummer et al. | |
| 6,692,136 B2 | 2/2004 | Marshall et al. | |
| 6,756,731 B1 * | 6/2004 | Sano | 313/499 |
| 2001/0015443 A1 | 8/2001 | Komoto | |
| 2001/0017874 A1 | 8/2001 | Ishida | |
| 2001/0042866 A1 | 11/2001 | Coman et al. | |
| 2003/0062530 A1 | 4/2003 | Okazaki et al. | |
| 2003/0189215 A1 | 10/2003 | Lee et al. | |
| 2004/0056254 A1 | 3/2004 | Bader et al. | |
| 2004/0077114 A1 | 4/2004 | Coman et al. | |
| 2005/0282373 A1 | 12/2005 | Bader et al. | |
| 2006/0121702 A1 | 6/2006 | Coman et al. | |

FOREIGN PATENT DOCUMENTS

| | | |
|---|---|---|
| EP | 1 061 590 | 12/2000 |
| EP | 1138747 A2 | 10/2001 |
| GB | 2 346 478 | 8/2000 |
| JP | 50-91292 | 12/1973 |
| JP | 52-004175 | 1/1977 |
| JP | 58-195276 | 11/1983 |
| JP | 61-007671 | 1/1986 |
| JP | 61-059886 | 3/1986 |
| JP | 61-158606 | 7/1986 |
| JP | 61-182256 | 8/1986 |
| JP | 61-182292 | 8/1986 |
| JP | 61-183986 | 8/1986 |
| JP | 62-132990 A | 6/1987 |
| JP | 64-001290 | 1/1989 |
| JP | 04-010418 | 1/1992 |
| JP | 4-29374 | 1/1992 |
| JP | 04-057329 | 2/1992 |
| JP | 05-029663 | 2/1993 |
| JP | 05-198689 | 8/1993 |
| JP | 06-232510 | 8/1994 |
| JP | 6-302857 | 10/1994 |
| JP | 07-0886640 | 3/1995 |
| JP | 07-263553 | 10/1995 |
| JP | 09-008403 | 1/1997 |
| JP | 09-129932 | 5/1997 |
| JP | 10-117016 | 5/1998 |
| JP | 10-163525 A | 6/1998 |
| JP | 10-209555 | 8/1998 |
| JP | 10-270761 | 10/1998 |
| JP | 11-068157 | 3/1999 |
| JP | 11-506872 | 6/1999 |
| JP | 11-214744 | 8/1999 |
| JP | 2000-077723 | 9/1999 |
| JP | 11-340518 | 12/1999 |
| JP | 2000-067673 | 3/2000 |
| JP | 2000-183408 | 6/2000 |
| JP | 2000-196141 | 7/2000 |
| JP | 2000-228537 | 8/2000 |
| JP | 2000-277804 | 10/2000 |
| JP | 2000-299503 | 10/2000 |
| JP | 2001-007394 | 1/2001 |
| JP | 2001-015817 | 1/2001 |
| JP | 2001-085747 | 3/2001 |
| JP | 2001-144331 | 5/2001 |
| JP | 2001-196645 | 7/2001 |
| JP | 2001-203385 | 7/2001 |
| JP | 2001-203392 | 7/2001 |
| JP | 2001-206710 | 7/2001 |
| JP | 2001-253294 | 9/2001 |
| JP | 2001-284641 | 10/2001 |
| JP | 2001-298214 | 10/2001 |
| JP | 2001-313422 | 11/2001 |
| JP | 2002-154900 | 5/2002 |
| JP | 2000-196152 | 12/2002 |
| WO | WO-96/36080 | 11/1996 |
| WO | WO 97/00535 | 1/1997 |
| WO | WO-00/44966 | 8/2000 |
| WO | WO-01-08452 A1 | 2/2001 |
| WO | WO-01/82384 | 11/2001 |
| WO | WO-03/034508 A1 | 4/2003 |

OTHER PUBLICATIONS

Office Action mailed Jan. 1, 2005, directed to related U.S. Appl. No. 10/614,342.

Han, J. et al. (1998). "AlGaN/GaN Quantum Well Ultraviolet Light Emitting Diodes," *Applied Physics Letters* 73(12):1688-1690.

Iwaya, M. et al. (2002). "Suppression of Phase Separation of AlGaN During Lateral Growth and Fabrication of High-efficiency UV-LED on Optimized AlGaN," *Journal of Crystal Growth* 237-239:951-955.

Shatalov, M. et al. (2002). "Deep Ultraviolet Light-Emitting Diodes Using Quaternary AlInGaN Multiple Quantum Wells," *IEEE Journal on Selected Topics in Quantum Electronics* 8(2):302-309.

Wong, W.S. et al. (2000). "$In_xGa_{1-x}N$ Light Emitting Diodes on Si Substrates Fabricated by Pd-In Metal Bonding and Laser Lift-Off," *Applied Physics Letters* 77(18): 2822-2824.

Kneissl M. et al. (2001). "Continuous-Wave Operation of InGaN Multiple-Quantum-Well Laser Diodes on Copper Substrates Obtained by Laser Liftoff," *IEEE Journal on Selected Topics in Quantum Electronics* 7(2):188-191.

Japanese Office Action dated Apr. 10, 2007, directed to counterpart JP application No. 2003-537131, 3 pages.

European Search Report dated Mar. 2, 2007, directed at related EP application No. 03015373.

Japanese Office Action mailed Dec. 19, 2006, directed to counterpart foreign application No. JP-2003-190549.

* cited by examiner

LIGHT EMITTING APPARATUS AND METHOD OF MANUFACTURING THE SAME

TECHNICAL FIELD

The present invention relates to a light emitting apparatus that can be used as light source for illumination, LED display, back light for display, traffic light, light source for illuminating switch, various sensors and indicators and a method of manufacturing the same

BACKGROUND ART

Light emitting apparatuses (white light emitting apparatus) capable of emitting white light have been developed and put in practical use in recent years, that combine a light emitting device chip constituted using a gallium nitride-based compound semiconductor and a fluorescent substance. The light emitting apparatus emits blended light of white color by converting the wavelength of part of blue light, that is emitted by the light emitting device, by means of a fluorescent substance and mixing this light having the converted wavelength and the blue light emitted by the light emitting device.

In the prior art, it has been a common practice to manufacture a light emitting apparatus by molding a package or the like, wherein a light emitting device is mounted, with a resin containing a fluorescent substance. It has also been common to fasten (die-bond) the bottom surface of the light emitting device onto the top surface of a supporting body by means of an organic thermosetting resin.

For example, Japan Unexamined Patent Publication (Kokai) No. 2001-144331 discloses a method of bonding a light emitting device and a lead frame with a silver paste consisting of epoxy resin containing silver dispersed therein. A white light emitting apparatus is constituted by filling a cup wherein the light emitting device is mounted with an epoxy resin containing a fluorescent substance dispersed therein.

Japan Unexamined Patent Publication (Kokai) No. 2000-183408 discloses a white light emitting apparatus made by fastening a light emitting device onto a lead frame, then applying a pre-dipping thermosetting resin containing a blue light emitting fluorescent substance and a pre-dipping thermosetting resin containing a yellow light emitting fluorescent substance successively, and curing the thermosetting resins.

DISCLOSURE OF INVENTION

However, the white light emitting apparatus of the prior art uses the resin containing a fluorescent substance, and the molding resin is subjected to deterioration or discoloration when light of short wavelength is used or high optical power output that accompanies significant heat generation is employed.

Also in the white light emitting apparatus of the prior art, the bottom surface of the light emitting device is bonded onto the top surface of the supporting body by means of an organic resin. Therefore, the bonding resin is subjected to deterioration that results in a decrease in the bonding strength when light of short wavelength is used or high optical power output that accompanies significant heat generation is employed.

As a result, it has been difficult to make a light emitting apparatus having sufficient reliability by using a light emitting device that emits light including wavelength shorter than that of blue light.

The white light emitting apparatus of the prior art also has such a problem that thickness (quantity of the fluorescent substance) of the molding resin serving as a coating layer is different from point to point across the surface of the light emitting apparatus, resulting unevenness in the light intensity from the light emitting device and in the light intensity from the fluorescent substance.

Therefore, an object of the present invention is to provide a light emitting apparatus having a high reliability that uses a light emitting device that emits light including wavelength shorter than that of blue light and a fluorescent substance, and a method of manufacturing the same.

Another object of the present invention is to provide a light emitting apparatus that minimizes the color deviation with the direction and minimizes the unevenness in color tone when viewed from the emitted light observing surface.

According to a first aspect of the present invention, such a light emitting apparatus is provided that comprises:

a light emitting device disposed on a supporting body;

a fluorescent substance that absorbs at least a portion of light emitted by the light emitting device and emits light of a different wavelength; and a coating layer that contains the fluorescent substance and covers at least the surface of the light emitting device, wherein the coating layer is formed from oxide containing at least one element selected from the group consisting of Si, Al, Ga, Ti, Ge, P, B, Zr, Y, Sn, Pb and alkali earth metals, and hydroxide containing at least one element selected from the group consisting of Si, Al, Ga, Ti, Ge, P, B, Zr, Y, Sn, Pb and alkali earth metals.

According to the present invention, the coating layer is formed from inorganic material of which main component is an oxide containing at least one element selected from the group consisting of Si, Al, Ga, Ti, Ge, P, B, Zr, Y, Sn, Pb and alkali earth metals, while the coating layer binds the fluorescent substances and secures them onto the light emitting device. With this constitution, the coating layer is prevented from discoloring and/or deteriorating even when irradiated with light of relatively high energy density by the light emitting device. Thus it is not subjected to deterioration or discoloration unlike the case of using resin when light of high optical power output that accompanies significant heat generation or light of short wavelength such as ultraviolet ray is employed. According to the present invention, therefore, it is made possible to provide a light emitting apparatus that undergoes extremely small decrease in the efficiency of light emission even when used for a long period of time with high brightness.

The coating layer preferably contains an oxide as a major component and a hydroxide contained in the oxide. It is also preferable that the hydroxide contains the same element contained in the oxide, that is, the hydroxide is the remainder of an intermediate product of the dehydration condensation reaction of the oxide. Trace of the hydroxide contained in the coating layer results in the presence of a polar hydroxyl group in the surface of the coating layer, thus improving the bonding performance with the molding resin.

The coating layer preferably contains an organometallic compound containing at least one element selected from the group consisting of Si, Al, Ga, Ti, Ge, P, B, Zr, Y, Sn, Pb and alkali earth metals (more preferably an organometallic compound containing oxygen). The organometallic compound may be the starting material for the synthesis of the aforementioned oxide, that remains without reacting. As the coating layer contains the organometallic compound, the molding member can be formed with good bonding with the coating layer, also in the case of molding the coating layer with resin.

It is preferable that, in the coating layer, fluorescent substance particles are surrounded by particles of inorganic material constituted mainly from the oxide. Preferably, the fluorescent substance particles having a mean particle size of 3 to 10 µm are surrounded by fine particles of the inorganic material having a mean particle size of 3 to 10 nm, more preferably 1 to 20 nm. The fine particles of oxide contained in the coating layer makes it easier to relieve the thermal stress in the coating layer, thus effectively preventing cracks and other defects from occurring in the coating layer. Also because light entering the coating layer is diffused by the fine particles of the inorganic material that surround the fluorescent substance, wavelength conversion by the fluorescent substance can be done efficiently.

The coating layer is preferably formed with substantially the same thickness on the top surface, side faces and corners of the light emitting device. This provides substantially uniform optical paths for the light emitted by the light emitting device, and therefore uniform light emission characteristic. As a result, it is made possible to provide a light emitting apparatus that undergoes extremely small color deviation with the direction and small decrease in the efficiency of light emission even when used for a long period of time with high brightness.

The coating layer is also preferably a continuous layer that covers the surface of the supporting body and entire surface of the light emitting device and has substantially the same thickness in the portions located on the top surface, the sides face and the corners of the light emitting device and in the portion located on the surface of the supporting body. The additional portion of the coating layer formed on the supporting body has an effect of making the coating layer as a whole less likely to peel off the light emitting device and from the supporting body. Moreover, since the coating layer that contains the fluorescent substance is formed also on the supporting body, light of the initial wavelength that is randomly reflected through the molding member is subjected to wavelength conversion by the coating layer that is provided on the supporting body with a higher probability.

It is also preferable that the coating layer comprises at least two layers, each having a refractive index lower than that of the nitride semiconductor that constitutes the light emitting device, and the refractive index of each layer decreases gradually with the distance from the light emitting device. With this constitution, abrupt change in refractive index can be prevented from being produced in the interface between the light emitting device and the coating layer and in the interface between the coating layer and the atmosphere (or the molding resin). Thus it is made possible to suppress the reflection of light on the interfaces thereby to improve the efficiency of extracting light.

In case the light emitting device is fastened onto the top surface of the supporting body via an adhesive layer, the adhesive layer is preferably made of a material similar to that of the coating layer. In other words, the adhesive layer is preferably made of an inorganic material selected from among the same candidates as those for the coating layer. More preferably, the adhesive layer and the coating layer are made of the same material. When the adhesive layer and the coating layer are made of the same material, the coating layer and the adhesive layer will not be deteriorated or discolored even if a light emitting device that emits blue light or light including wavelength shorter than that of blue light is used. This allows for a light emitting apparatus having higher reliability.

The adhesive layer also preferably contains particles of oxide and hydroxide. When the adhesive layer is made up of numerous particles each measuring several nanometers across formed from an inorganic material as the main component, there exist voids between the particles. As a consequence, since abrupt change in temperature of the adhesive layer can be accommodated by expansion or contraction of the particles, the adhesive layer as a whole is not influenced significantly by thermal stress. In case the light emitting device is bonded with molten glass or a resin having a thermal expansion coefficient which is significantly different from that of the supporting body, in contrast, the adhesive layer is prone to peel off or crack due to thermal stress. The light emitting apparatus of the present invention can maintain reliability even when used in such a situation as the temperature changes abruptly.

The adhesive layer preferably extends continuously to the side faces of the light emitting device. This constitution prevents the light emitting device that is die-bonded onto the supporting body from being displaced from the position where it has been die-bonded. Also the adhesive layer formed to extend over the side faces of the light emitting device and the coating layer formed later on the light emitting device make close contact with each other on the side faces of the light emitting device. Since the layer contains a significant amount of the same material as that of the case wherein the adhesive layer and the coating layer formed from the same organometallic compound as the starting material are used, bonding performance is improved. As a result, the coating layer can be prevented from peeling off the light emitting device and light emitting apparatus of high reliability can be made.

It is preferable to make the light emitting device emit light with peak emission wavelength in a range from 350 nm to 530 nm, and the fluorescent substance emit light with main emission wavelength that is longer than the peak emission wavelength of the light emitting device. In the light emitting apparatus of the present invention, a fluorescent substance that is excited by ultraviolet ray can also be used. Also because the coating layer and the adhesive layer do not deteriorate or discolor even if a light emitting device that emits blue light or light including wavelength shorter than that of blue light is used, the light emitting apparatus having higher reliability can be provided.

When yttrium aluminum garnet fluorescent substance activated with cerium is used for the fluorescent substance, such a light emitting apparatus can be constituted that emits blended light of white color. Consequently, a white light emitting apparatus having less unevenness in the color of the emitted light can be provided.

In case the light emitting device emits in the ultraviolet region, the fluorescent substance contained in the coating layer preferably contains at least one selected from the group consisting of:

(1) $Ca_{10}(PO_4)_6FCl$: Sb, Mn
(2) $M_5(PO_4)_3Cl$: Eu ((M represents at least one element selected from among Sr, Ca, Ba, Mg)
(3) $BaMg_2Al_{16}O_{27}$: Eu
(4) $BaMg_2Al_{16}O_{27}$: Eu, Mn
(5) $3.5MgO.0.5MgF_2.GeO_2$: Mn
(6) $Y_2O_2S$: Eu
(7) $Mg_6As_2O_{11}$: Mn
(8) $Sr_4Al_{14}O_{25}$: Eu
(9) $(Zn, Cd)S$: Cu

(10) $SrAl_2O_4$: Eu
(11) $Ca_{10}(PO_4)_6ClBr$: Mn, Eu
(12) $Zn_2GeO_4$: Mn
(13) $Gd_2O_2S$: Eu, and
(14) $La_2O_2S$: Eu Use of these fluorescent substances enables it to make a light emitting apparatus having higher efficiency of light emission.

The supporting body is preferably insulated from lead electrodes of the light emitting device. While the electric power required by the light emitting device to emit light is supplied through wires, they are insulated from the lead electrodes and are therefore not affected by the current flowing in the lead electrodes, so that generation of noise is prevented. Therefore, a light emitting apparatus having high reliability can be made. In case the supporting body is not insulated from lead electrodes, in contrast, namely a lead electrode serves as the supporting body on which the light emitting device is fastened, for example, the wire that connects the other lead electrode and the light emitting device and the lead electrode that serves as the supporting body can easily be short-circuited, leading to a decrease in the yield of production. When the light emitting device is fastened onto the supporting body that is insulated from the positive and negative lead electrodes, as in the case of the present invention, the yield of production can be improved.

According to a second aspect of the present invention, there is provide a method of manufacturing a light emitting apparatus comprising a light emitting device disposed on a supporting body, a fluorescent substance that absorbs at least a portion of light emitted by the light emitting device and emits light of converted wavelength and a coating layer that contains the fluorescent substance and covers at least the surface of the light emitting device is provided, the method comprising:

(1) a first step of preparing a coating solution that contains an organometallic compound containing at least one element selected from the group consisting of Si, Al, Ga, Ti, Ge, P, B, Zr, Y, Sn, Pb and alkali earth metals (preferably containing oxygen, too), an organic solvent and a fluorescent substance;
(2) a second step of applying the coating solution to the surface of the light emitting device and to the surface of the supporting body; and
(3) a third step of drying the coating solution so as to fix the fluorescent substance.

The manufacturing method of the present invention makes it possible to manufacture a light emitting apparatus wherein the fluorescent substance is bound by means of an inorganic material that is not degraded by the exposure to ultraviolet ray.

In the first step, the organic solvent preferably has a boiling point in a range from 100° C. to 200° C. Such an organic solvent makes it possible to apply the coating solution with improved workability, since solidification of the organometallic compound and other components is retarded.

In the first step, it is also preferable that the solution of the organometallic compound is hydrolysate solution having viscosity of 2.5 to 500 cps at 25° C. In the prior art, the coating solution containing the fluorescent substance and other components contained much moisture that deteriorated the surface condition of the light emitting device thereby adversely affecting the optical characteristics of the light emitting device. To solve this problem, such a coating solution is prepared in the state of sol that hardly contains moisture which has adverse effect on the light emitting device, and is applied onto the surface of the light emitting device that is then heated so as to form the coating layer (predominantly amorphous). With this process, the coating layer with the fluorescent substance bound therein can be easily formed without compromising the metal surface condition of the light emitting device.

In the first step, acid concentration in the coating solution is preferably in a range from 20 to 500 ppm. Since the acid concentration in this range does not deteriorate the metal surface condition of the light emitting device, the light emitting apparatus can be manufactured without adversely affecting the optical characteristics of the light emitting device.

In the second step, the coating solution containing the fluorescent substance may also be sprayed in the state of mist while rotating in spiral from above the light emitting device that is disposed on the supporting body and is heated. With this method, the light emitting apparatus that is capable of uniform light emission without unevenness in light intensity can be manufactured in mass production with high yield. In this case, the light emitting device is heated preferably in a range from 50° C. to 300° C.

Spraying the coating solution while heating the light emitting device accelerates the gelation and coagulation into particles of the hydrolysate in the coating layer. The coating solution that has been applied must be dried quickly, in order to turn the organometallic compound contained in the coating solution into fine particles of oxide. By spraying the coating solution in the state of mist while heating the light emitting device, it is made possible to quickly dry the coating solution and easily form the fine particles of oxide in the coating layer. In order to form fine particles of desired size in the coating layer, it is preferable to spray the coating solution while heating the light emitting device in a range from 50° C. to 200° C., more preferably from 70° C. to 120° C.

In the first step, the organometallic compound is preferably at least one selected from among the group consisting of methyl silicate, ethyl silicate, N-propyl silicate, N-butyl silicate, aluminum isopropoxide, aluminum ethoxide and aluminum butoxide. These materials are less likely to deteriorate when exposed to ultraviolet ray.

According to a third aspect of the invention, there is provided a light emitting apparatus comprising:

a light emitting device made by forming gallium nitride-based compound semiconductor layer on a substrate; and a supporting body that supports the light emitting device via an adhesive layer, wherein the adhesive layer contains oxide containing at least one element selected from the group consisting of Si, Al, Ga, Ti, Ge, P, B, Zr, Y, Sn, Pb and alkali earth metals and hydroxide containing at least one element selected from the group consisting of Si, Al, Ga, Ti, Ge, P, B, Zr, Y, Sn, Pb and alkali earth metals.

According to the present invention, since the light emitting device is die-bonded onto the supporting body such as a metal package by means of an adhesive layer made of an inorganic material, the adhesive layer does not deteriorate or discolor through exposure to light from the light emitting device and the accompanying temperature rise, even when combined with a light emitting device that emits light including wavelength shorter than that of blue light. Consequently, the light emitting apparatus having high reliability can be made.

The adhesive layer preferably contains particles of oxide and hydroxide. When the adhesive layer is made up of numerous particles each measuring several nanometers across that are formed from an inorganic material as the main component, there exist voids between the particles. As a consequence, since abrupt changes in the temperature of the adhesive layer can be accommodated by expansion or contraction of the particles, the adhesive layer as a whole is not influenced significantly by thermal stress. In case the light emitting device is bonded with molten glass or a resin having a thermal expansion coefficient significantly different from that of the supporting body, in contrast, the adhesive layer is prone to peel off or crack due to thermal stress. The light emitting apparatus of the present invention can maintain reliability even when used in such a situation as the temperature changes abruptly. The fine particles of oxide and hydroxide have particle size preferably in a range from 1 to 20 nm.

The adhesive layer preferably extends continuously to the side faces of the light emitting device. This constitution prevents the light emitting device that is die-bonded onto the supporting body from being displaced from the position where it has been die-bonded, so that the light emitting apparatus of high reliability can be made.

In the light emitting apparatus of the present invention, a light emitting device that emits light with peak emission wavelength in a range from 250 nm to 530 nm can be used. The adhesive layer is not deteriorated or discolored by the exposure to the light even if a light emitting device that emits light including wavelength shorter than that of blue light is used, and is not deteriorated or discolored by the exposure to the light of high output power and the accompanying temperature rise. As a result, the light emitting apparatus having higher reliability can be provided.

The adhesive layer preferably contains a filler having heat conductivity which is at least higher than that of the oxide or the hydroxide. When the adhesive layer contains such a filler, the light emitting apparatus can be made durable to a high temperature caused by light of high output power, with high heat dissipating effect.

According to a fourth aspect of the invention, there is provided a method of manufacturing a light emitting apparatus comprising a light emitting device made by forming gallium nitride-based compound semiconductor layers on a substrate and a supporting body that supports the light emitting device on the bottom surface thereof via an adhesive layer, the method comprising:

(1) a first step of preparing an adhesive solution, that contains organometallic compound containing at least one element selected from the group consisting of Si, Al, Ga, Ti, Ge, P, B, Zr, Y, Sn, Pb and alkali earth metals and oxygen, and an organic solvent in the form of hydrolysate solution having viscosity of 2.5 to 500 cps at 25° C. and acid concentration from 20 to 500 ppm;

(2) a second step of supplying the adhesive solution onto the top surface of the supporting body and placing the light emitting device on the adhesive solution; and (3) a third step of drying the adhesive solution at a temperature in a range from 50° C. to 300° C., so as to bond the bottom surface of the light emitting device onto the top surface of the supporting body.

According to the present invention, the light emitting apparatus having the light emitting device die-bonded on the supporting body by means of an inorganic material can be made easily. In the light emitting apparatus manufactured according to the present invention, the adhesive layer is not deteriorated or discolored by the exposure to light and heat generated by irradiation with light of a wavelength shorter than blue light or having high output power. As a result, the light emitting apparatus having higher reliability can be manufactured than in the case of the conventional light emitting apparatus wherein a resin containing an organic resin is used for die bonding. Also because the acid concentration is controlled in a range from 20 to 500 ppm, applying the adhesive solution to the surface of the metal package does not lead to corrosion of the surface by acid or alkali. Moreover, since the adhesive solution turns to amorphous at a temperature in a range from 50° C. to 300° C., the light emitting device is less likely to be displaced from the position where it has been placed.

Heating the adhesive solution so as to solidify accelerates the gelation and coagulation into particles of the hydrolysate in the adhesive layer. The adhesive solution that has been applied must be dried quickly, in order to turn the organometallic compound contained in the adhesive solution into fine particles of oxide. By heating the adhesive solution, it is made possible to quickly dry the coating solution and easily form the fine particles of oxide in the adhesive layer. In order to form fine particles of desired size in the adhesive layer, it is preferable to heat the adhesive solution to at least 150° C. or higher, more preferably to 200° C. or higher.

In the second step, it is preferable to place a proper amount of the hydrolysate solution in the state of sol by stamping or dispensing to a predetermined position on the top surface of the supporting body, and then die-bond the light emitting device while applying a pressure thereto from above. This causes the adhesive solution to extend also to the side faces of the light emitting device, and therefore the light emitting apparatus of high reliability can be made where the light emitting device is not displaced from the position where it has been die-bonded.

The adhesive layer formed in the third step is preferably made up of numerous particles each measuring several nanometers across that are formed from an inorganic material as the main component, wherein voids exist between the particles. With this constitution, since abrupt changes in temperature of the adhesive layer can be accommodated by expansion or contraction of the particles, effect of the thermal stress can be mitigated. Therefore, unlike the case where the light emitting device is bonded with molten glass or a resin having a thermal expansion coefficient significantly different from that of the supporting body, the adhesive layer is less likely to undergo peel off or crack due to thermal stress.

In the first step, the organic solvent has a boiling point preferably in a range from 100° C. to 200° C. Since an organic solvent having such a high boiling point exists in liquid phase at the normal temperature, precipitation of $SiO_2$ or the like can be suppressed as the adhesive solution dries. As a result, such a trouble can be prevented as a solidified substance sticks to a nozzle end of a dispenser or to the edge of an application needle of a stamping apparatus that might lead to variations in the quantity of the adhesive solution supplied.

In the first step, the organometallic compound is preferably at least one selected from among metal alkoxide, metal diketonate and metal carbonate. Then the adhesive layer used for die bonding can be made of an inorganic material that is not deteriorated by exposure to ultraviolet ray.

In the first step, the adhesive solution preferably contains a filler having higher heat conductivity than that of the oxide that constitutes the adhesive solution. When the adhesive solution contains the filler, the light emitting apparatus can be made durable to a high temperature caused by light of high output power, with high heat dissipating effect.

According to a fifth aspect of the present invention, there is provided a method of manufacturing a light emitting apparatus comprising a light emitting device disposed on a supporting body, a fluorescent substance that absorbs at least a portion of light emitted by the light emitting device and emits light of converted wavelength and a coating layer that holds the fluorescent substance and covers the surface of the supporting body and the entire surface of the light emitting device, the method comprising:

(1) a step of placing the light emitting device on the supporting body; and
(2) a step of spraying the coating solution, that contains the fluorescent substance in the state of mist while rotating in spiral, from above the light emitting device that is disposed on the supporting body and is heated.

This manufacturing method may be applied not only to the coating material consisting of the inorganic material as in the present invention but also to a coating material made of an organic resin of the prior art. For example, the method can be applied to the formation of a coating layer constituted from a fluorocarbon resin (PTFE) or a silicone resin containing a fluorescent substance.

Color unevenness over the light emitting surface and variations among light emitting apparatuses are supposed to be caused by non-uniformity in the planar distribution of the fluorescent substance contained in the coating layer generated when forming the coating layer. The coating layer can be formed on a cup by discharging a resin containing the fluorescent substance from a tube such as nozzle having a narrowed tip. However, it is very difficult to apply the fluorescent substance contained in the binder for the coating layer onto the light emitting device uniformly and quickly. Also the resultant shape of the coating layer thus formed varies depending on the viscosity of the binder contained in the coating layer and on the surface tension generated between the coating layer and the package surface. As a result, thickness of the coating layer (hence the quantity of the fluorescent substance) varies from point to point, leading to localized unbalance between the light intensity emitted by the light emitting device and the light intensity emitted by the fluorescent substance. This results in localized unevenness in color tone due to dominance of the light emitted by the light emitting device or dominance of the light intensity emitted by the fluorescent substance. There will also be variations from one light emitting apparatus to another. According to the manufacturing method of the present invention where the coating solution is sprayed in the form of mist, the fluorescent substance can be disposed uniformly over the light emitting device and on other portions, thereby improving the color tone distribution and directivity.

The coating solution can be sprayed in the form of mist by means of, for example, a spraying apparatus. When mist of the coating solution is carried in a gas stream directed at right angles to the top surface of the light emitting device, however, the coating solution flows in a direction parallel to the side face of the light emitting device, so that mist of the coating solution flows along the side face of the light emitting device without depositing thereon immediately after starting the spraying. Also there is such a problem that a portion of the surface of the light emitting device behind an electrically conductive wire receives less spray, resulting in thinner coating layer than other portions. In order to apply the coating solution uniformly over the entire surface of the light emitting device, it has been necessary to turn the light emitting device or the nozzle so as to expose all surface of the light emitting device to the coating solution stream, or repeat the spraying to the side faces. As a result, it has been difficult to apply coating solution to the light emitting device over the corner to the side faces thereof. The thickness of the resultant coating layer tends to be different between the top surface and the side faces. Furthermore, there has been such a problem that fast stream of the mist of coating solution deforms or breaks the electrically conductive wires that connect the pair of positive and negative electrodes of the light emitting device and external electrodes.

According to the present invention, the coating solution and a gas are ejected from a nozzle in a spiral stream. The apparatus has several gas vents disposed around the nozzle, each vent being arranged so that the gas spouted therefrom is directed at a predetermined angle to the surface to be coated. When the gas is supplied, gas streams from the vents disposed in a ring shape around the nozzle for the coating solution join so as to form a single stream of spiraling flow, like tornado inverted up side down. The nozzle of this apparatus has an outlet of the coating solution provided at the center thereof. When the coating solution and the gas are ejected at the same time, mist of the coating solution is carried by the spiraling flow, like tornado inverted up side down, while being diffused.

According to the manufacturing method of the present invention, the coating layer containing the fluorescent substance can be formed with uniform thickness. As a result, color unevenness with the direction and variation in the color tone over the light emitting surface can be minimized and a light emitting apparatus having improved efficiency of wavelength conversion can be manufactured.

The diameter of the spiraling stream preferably increases from the start point above the light emitting device toward the surface of the light emitting device. This improves the workability and minimizes the color unevenness with the direction and variation in the color tone over the light emitting surface, so that a light emitting apparatus having improved efficiency of wavelength conversion can be manufactured.

Rotating speed of the spiraling stream of the coating solution preferably decreases from the start point above the light emitting device toward the surface of the light emitting device. This prevents the surface of the light emitting device from being impacted with shock by the fluorescent substance particles contained in the coating solution, and minimizes the color unevenness with the direction and variation in the color tone over the light emitting surface, so that a light emitting apparatus having improved efficiency of wavelength conversion can be manufactured.

With the method of manufacturing the light emitting apparatus according to the present invention, since the fluorescent substance is deposited on the package whereon a plurality of light emitting devices are arranged, it is made possible to simultaneously manufacture a large number of light emitting apparatuses satisfactorily. Even when the quantity of the fluorescent substance deposited on the light emitting device is very small, quantity of the fluorescent substance (namely thickness of the coating layer) can be controlled to be uniform. As a result, light emitting apparatuses having less variability can be manufactured.

BRIEF DESCRIPTION OF THE DRAWINGS

The above and other objectives and features of the present invention will become more apparent from description of a preferred embodiment thereof with reference to the accompanying drawings, throughout which like parts are designated by like reference numerals, and wherein.

BEST MODE FOR CARRYING OUT THE INVENTION

Now preferred embodiments of the present invention will be described below with reference to attached drawings.

Embodiment 1

Figure 1:
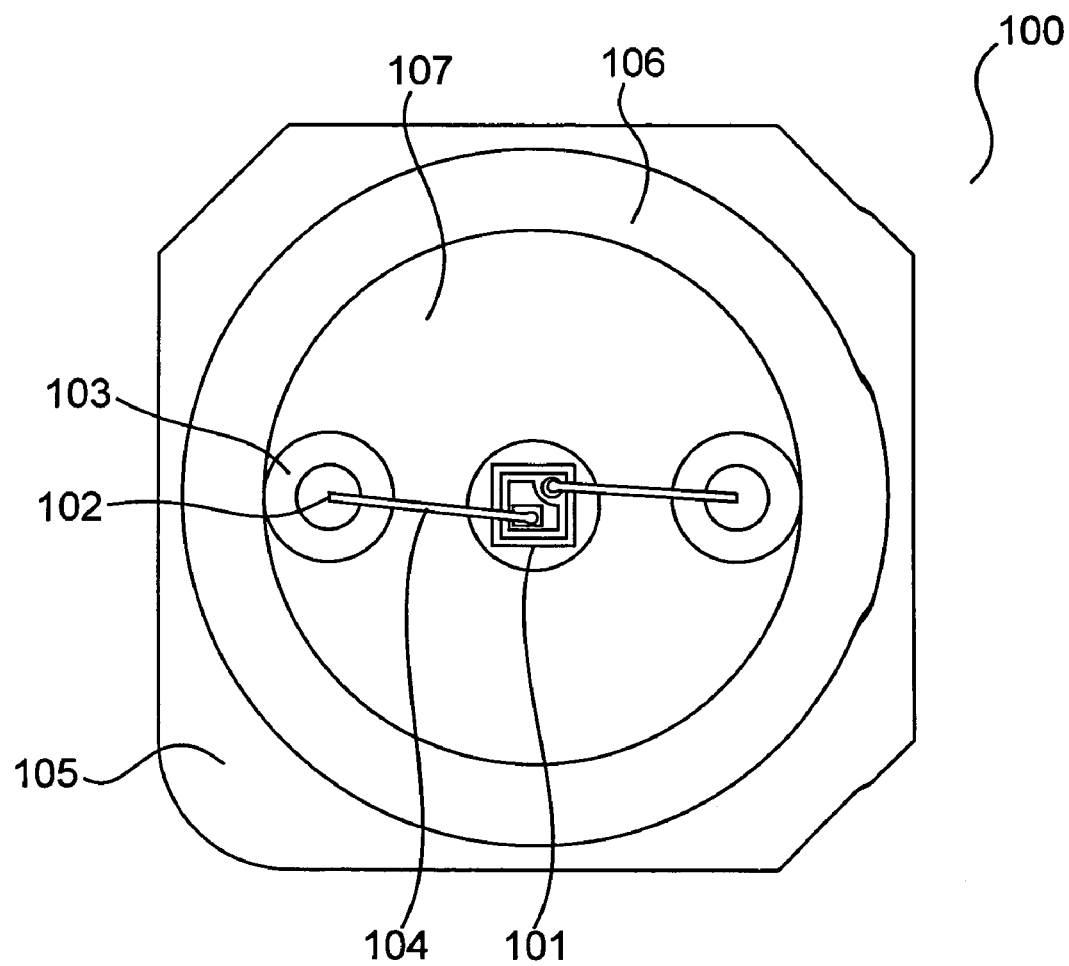
FIG. 1 is a schematic top view of a light emitting apparatus according to one embodiment of the present invention.
Figure 2:
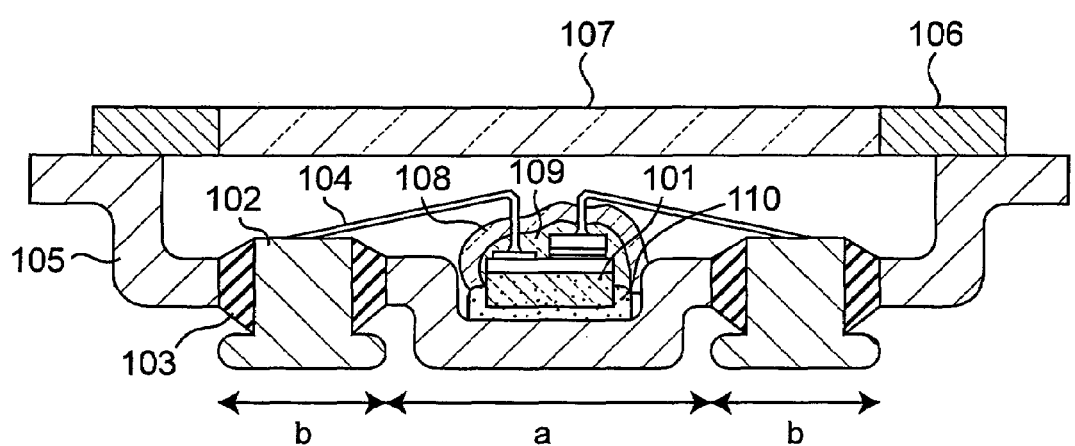
FIG. 2 is a schematic sectional view of the light emitting apparatus shown in FIG. 1.

FIG. 1 and FIG. 2 are top view and sectional view, respectively, showing an example of a light emitting apparatus manufactured according to the method of the present invention.

In FIG. 1 and FIG. 2, an LED 101 that is a light emitting device is mounted in a metallic package 105. The package 105 has a recess "a" located at the center thereof. A base portion "b" that surrounds the recess "a" has two through holes penetrating in the direction of thickness, the through holes opposing each other across the recess "a". Positive and negative lead electrodes 102 are inserted through the respective through holes via hard glass 103 that serves as an insulating member. The metal package 105 has a light transmitting window 107 and a lid 106 comprising a metal part provided on the principal surface thereof, so that the light emitting deice and other component are hermetically sealed together with nitrogen gas in the package, by welding the metallic part of the lid 106 and the contact surface of the metal package 105. The LED chip 101 housed in the recess "a" is the light emitting device that emits blue light or ultraviolet ray. The LED chip 101 and the metal package 105 are bonded with each other via an adhesive layer 110 that is made by drying and firing a hydrolysate solution of ethyl silicate.

A coating layer 109 made by binding CCA-Blue (chemical formula $Ca_{10}(PO_4)_6ClBr$, activated with Mn, Eu) fluorescent substance by means of $Al_2O_3$ is formed on the light emitting device in the recess "a" that is insulated from the lead electrode 102 as shown in FIG. 2, and a coating layer 108 is formed thereon that is made by binding yttrium aluminum garnet-based fluorescent substance with $SiO_2$.

Now component members according to the present invention will be described in detail below with reference to the accompanying drawings.

[Coating Layers 108, 109]

The coating layers 108, 109 used in this embodiment are constituted mainly from oxides ($SiO_2$, $Al_2O_3$). The coating layers are provided, separately from the molding member, in the cup of the mount lead and in an opening of the package, and contain a fluorescent substance that converts the light emitted by the LED chip 101 and a material that binds the fluorescent substance.

Due to the reflection on the package and other surface, light of high energy emitted by the LED chip fills the coating layers 108, 109 with high density. Light is reflected and diffused also by the fluorescent substance, and inside of the coating layers 108, 109 is exposed to light of high energy. Since the oxide containing at least one element selected from the group consisting of Si, Al, Ga, Ti, Ge, P, B, Zr, Y, Sn, Pb and alkali earth metals has high light fastness, reliability of the light emitting apparatus can be improved by using such material as the binder.

The coating layers 108, 109 have substantially constant thickness over the top surface, side faces and on corners of the light emitting device 101 as shown in FIG. 2. This provides substantially uniform optical paths for the light emitted by the light emitting device, and therefore uniform light emission characteristic. As a result, it is made possible to provide a light emitting apparatus that undergoes extremely small color deviation with direction and decrease in the efficiency of light emission even when used for a long period of time with high brightness. There will also be less color unevenness in the light emitting surface and less variations from one light emitting apparatus to another.

The coating layers 108, 109 join with the adhesive layer 110, that is made of a similar inorganic material, on the side faces of the chip 101. As a result, the coating layers 108, 109 are fastened onto the chip 101 securely, and are less likely to peel off.

Also because the coating layers 108, 109 are made of $SiO_2$ and $Al_2O_3$, refractive index thereof is lower than that of the nitride semiconductor that constitutes the light emitting device 101, with the refractive index decreasing gradually with the distance from the light emitting device 101. With this constitution, abrupt changes in refractive index can be prevented from being produced in the interface between the light emitting device 101 and the coating layer 109 and in the interface between the coating layer 108 and the atmosphere, thus enabling it to extract light to the outside efficiently.

Also in the coating layers 108, 109, fluorescent substance particles are surrounded by particles of a material constituted mainly from $SiO_2$ or $Al_2O_3$. Specifically, the fluorescent substance particles having a mean particle size of 3 to 10 μm are surrounded by fine particles of the inorganic material having a mean particle size of 1 to 20 nm. The fine particles of oxide contained in the coating layer make it easier to relieve the coating layer of the thermal stress, thus effectively preventing cracks and other defects from occurring in the coating layer. Also because light entering the coating layers 108, 109 is diffused by the fine particles of the inorganic material that surround the fluorescent substance, wavelength conversion by the fluorescent substance can be done efficiently.

As the material to make the coating layer, a light transmitting inorganic material such as $SiO_2$, $Al_2O_3$ or $MSiO_3$ (M represents such an element as Zn, Ca, Mg, Ba, Sr, Zr, Y, Sn, Pb) with the fluorescent substance contained therein is preferably used. Such a light transmitting inorganic material binds the fluorescent substance particles. The fluorescent substance deposits on the LED chip and on the supporting body in the form of layer and is bound thereon. According to the present invention, oxide and hydroxide containing at least one element selected from the group consisting of Si, Al, Ga, Ti, Ge, P, B, Zr, Y, Sn, Pb and alkali earth metals is produced from organometallic compound containing at least one element selected from the group consisting of Si, Al, Ga, Ti, Ge, P, B, Zr, Y, Sn, Pb and alkali earth metals (preferably containing oxygen as well). The organometallic compound contains compounds that have an alkyl group or an aryl group. For such an organometallic compound, for example, metal alkoxide, metal diketonate, metal diketonate complex and metal carbonate may be used. Among these, use of a organometallic compound that is in liquid phase at the normal temperature and adding an organic solvent thereto makes it easy to control the viscosity for better workability and prevent solidification of the organometallic compound, thereby improving the ease of operation. Since the organometallic compound easily undergoes the chemical reaction such as hydrolysis, coating layer with the fluorescent substance bound therein by means of oxide containing at least one element selected from the group consisting of Si, Al, Ga, Ti, Ge, P, B, Zr, Y, Sn, Pb and alkali earth metals can easily be formed. Therefore, the method using the organometallic compound is capable of forming the coating layer without decreasing the light emitting performance of the LED and improve the yield of production, unlike the conventional methods wherein the coating layer is formed on the LED at a high temperature of 350° C. or higher or under charge of static electricity.

Now the material that constitutes the coating layer will be described below, taking example in $SiO_2$ and $Al_2O_3$.

(Coating Layer 108 wherein Fluorescent Substance is Bound with $SiO_2$)

The coating layer wherein fluorescent substance is bound with $SiO_2$ may be formed in such a process as follows. A fluorescent substance (powder) is dispersed uniformly in silica sol that is made by mixing alkyl silicate and an organic solvent having high boiling point in a predetermined ratio so as to prepare the coating solution. After applying the silica sol containing the fluorescent substance dispersed therein so as to cover the entire surface of the light emitting device by spraying or dispensing, the fluorescent substance particles are bound by means of $SiO_2$ and bonded onto the surface of the light emitting device.

The alkyl silicate used as a reinforcer of concrete, a pigment of plastics or a surface coating agent is prepared by hydrolyzing a monomer represented by the following general formula and polycondensing the hydrolysate. In the general formula, R is an alkyl group. When R is a methyl group, methyl silicate is obtained, and when R is an ethyl group, ethyl silicate is obtained. Also when R is an n-propyl group, N-propyl silicate is obtained, and when R is an n-butyl group, N-butyl silicate is obtained.

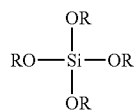

Ethyl silicate as a kind of the alkyl silicate has a structure shown in the following formula and is a clear and colorless liquid synthesized by the reaction between silicon tetrachloride and ethanol or the reaction between metallic silicon and ethanol. A monomer represented by the above general formula wherein R is an ethyl group is hydrolyzed to form a molecule having a hydroxyl group (OH group) (for example, silanol monomer as an intermediate) and plural molecules having a hydroxyl group (OH group) are condensed with each other by elimination of a water molecule ($H_2O$) to form a siloxane bond wherein Si atoms are bonded via O (oxygen atom), and thus a structure shown in the following formula is obtained.

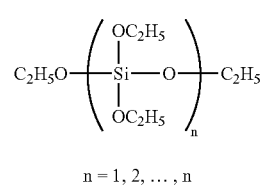

$n = 1, 2, \ldots, n$

When a solution of ethyl silicate is reacted with water in the presence of a catalyst, the hydrolysis reaction occurs as shown in the following reaction scheme, and thus the solution turns into a sol (solation) containing fine particles of $SiO_2$ dissolved therein and the resulting sol dries spontaneously to turn into a gel (gelation) as a result of an increase in concentration of the solution. Although the viscosity increases as the reaction proceeds, proceeding of the reaction is controlled in consideration of the thickness of the coating layer to be formed, and workability.

The hydrolysis reaction proceeds very slowly under neutral conditions, but proceeds faster while accompanying heat generation in the presence of an acid or a base as the catalyst. When using a basic catalyst, the resulting hydrolysate solution is unstable and is likely to cause excess gelation, thereby to lower the workability. Therefore, in this embodiment, the hydrolysis reaction is effected over a long time using a small quantity of an acidic catalyst such as hydrochloric acid.

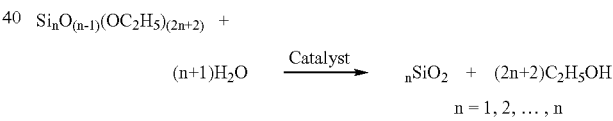

$n = 1, 2, \ldots, n$

The hydrolysis reaction of ethyl silicate proceeds faster as the temperature is higher, and proceeds even faster when the product ethanol is removed. When a gel produced through the hydrolysis reaction of ethyl silicate is heated, $SiO_2$ of mainly amorphous state is generated. Therefore, when a hydrolysate solution of ethyl silicate, which contains a fluorescent substance, is applied to the surface of a light emitting device and a supporting body except for the surface of the light emitting device and then heated, a coating layer wherein fluorescent substance is bound with $SiO_2$ can be formed on the surface of the light emitting device. Particularly in this embodiment, ethyl silicate is prepared as a hydrolysate solution in the state of sol, and the hydrolysate solution is applied to the surface of the light emitting device after adding the fluorescent substance to the hydrolysate solution. In the prior art, since the coating liquid containing the fluorescent substance contains much moisture, there have been such problems as surface condition of the light emitting device deteriorates by application of the coating liquid, thus giving an adverse effect on the optical characteristic of the light emitting device. According to the method of this embodiment, the hydrolysate solution of ethyl silicate in the state of sol hardly contains moisture and produces mainly amorphous $SiO_2$ simply by heating. Therefore, the coating layer wherein the fluorescent substance is bound with $SiO_2$ can be easily formed on the surface of the light emitting device without causing deterioration of the optical characteristic of the light emitting device.

Appropriate control of the reaction conditions makes it possible to incorporate trace quantity of $Si(OH)_4$ as an intermediate for formation of $SiO_2$ and starting materials such as ethyl silicate and ethanol into the coating layer. When trace amount of an inorganic material such as $Si(OH)_2$ and an organic material such as unreacted ethyl silicate or ethanol exist in the coating layer, a functional group having polarity such as hydroxyl group and a hydrophobic group (lipophilic group) such as ethyl group exist on the surface of the coating layer. Due to the existence of such a functional group, when a hydrophobic material having polarity such as fluororesin and a resin material having a hydroxyl group at the end of a molecular structure are used as a molding member on the coating layer, small quantity of the molding member can be disposed on the coating layer with good adhesion because of good affinity or wettability between the surface of the coating layer and the molding member.

When large quantity of the inorganic material such as $SiO_2$ or $Si(OH)_2$ exists in the coating layer and the adhesive layer, not only deterioration due to ultraviolet ray can be prevented, but also the coating layer or the adhesive layer can be disposed with good adhesion with the metal surface because of good affinity or wettability of the LED chip or package with the metal surface (it is considered that an electrostatic bond of $SiO_2$ and $Si(OH)_2$ with metal ions is formed). Furthermore, since the functional group having polarity, which exists in a molecular structure of the resin used as the molding member, has good affinity or wettability with the inorganic material having polarity such as $SiO_2$ and $Si(OH)_2$ in the coating layer, the molding member can be disposed on the coating layer with good adhesion. When the coating layer or adhesive layer wherein the fluorescent substance is bound with $SiO_2$ is formed using an organometallic compound such as silicate, since the coating layer or adhesive layer is mainly made of an inorganic material but has slight remaining property as an organic material, it exhibits good affinity with the surfaces of the LED chip and package constituting the light emitting apparatus or optionally used molding member, and thus yield of production is improved and deterioration due to ultraviolet ray hardly occurs.

(Coating Layer 109 wherein the Fluorescent Substance is Bound with $Al_2O_3$)

The coating layer wherein the fluorescent substance is bound with $Al_2O_3$ can be formed from the coating solution prepared by dispersing the fluorescent substance (powder) uniformly in alumina sol made by mixing an aluminum alcoholate or an aluminum alkoxide and an organic solvent having high boiling point in predetermined proportion, by spraying or dispensing the coating solution so as to cover the entire surface of the light emitting device with the alumina sol containing the fluorescent substance dispersed therein, and fixing the fluorescent substances with the $Al_2O_3$ material and fixing to the surface of the light emitting device.

The aluminum alcoholate or aluminum alkoxide is an organoaluminum compound used as thickeners, gelling agents, curing agents and polymerization catalysts of coating materials as well as dispersants of pigments.

Aluminum isopropioxide, aluminum ethoxide or aluminum butoxide, as a kind of the aluminum alcoholate or aluminum alkoxide, is clear and colorless liquid at normal temperature and is drastically reactive, and also reacts with moisture in an air to form aluminum hydroxide, which turns into aluminum oxide by heating. As shown in the following reaction scheme, aluminum isopropioxide is easily reacted with water and turns finally into aluminum hydroxide or alumina.

Accordingly, the coating solution, that is prepared by binding the fluorescent substance with $Al_2O_3$ that is generated by having aluminum isopropoxide react with water contained in the air, is applied to the surface of the light emitting device and the supporting body other than the surface of the light emitting device, thereby to form the coating layer.

The coating layer wherein fluorescent substance is bound with $SiO_2$ and the coating layer wherein fluorescent substance is bound with $Al_2O_3$ may be provided either by forming only the coating layer wherein fluorescent substance is bound with $SiO_2$ or only the coating layer wherein fluorescent substance is bound with $Al_2O_3$ on the same light emitting device, or by forming two or more layers on the same light emitting device by combining the coating layer wherein fluorescent substance is bound with $SiO_2$ and the coating layer wherein fluorescent substance is bound with $Al_2O_3$. Since the method of forming the coating layer by spraying according to the present invention allows it to control the thickness of two layers, coating layers of the same configuration can easily be formed. For example, a coating layer using $Al_2O_3$ is formed on the light emitting device, and another coating layer using $SiO_2$ is formed thereon. The fluorescent substance may be contained either in both layers, in one layer only, or may not be contained in both layers. Such a constitution has an effect of improving the efficiency of extracting light, since refractive index of the coating layer wherein fluorescent substance is bound with $SiO_2$ is smaller than that of the coating layer wherein fluorescent substance is bound with $Al_2O_3$, while refractive index of the coating layer wherein fluorescent substance is bound with $Al_2O_3$ is smaller than that of gallium nitride-based compound semiconductor layer. In case the coating layer is formed in a single layer, an abrupt change in the refractive index in the interface between the coating layer and the atmosphere or the nitride semiconductor light emitting device may result in reflection of part of light extracted from the light emitting device at the interface, thus leading to a decrease in the efficiency of extracting light.

Since the coating layer wherein the fluorescent substance is bound with $SiO_2$ and the coating layer wherein fluorescent substance is bound with $Al_2O_3$ that are formed as described above are made of inorganic materials unlike the resin used in the prior art, they are far less likely to deteriorate when exposed to ultraviolet ray, and therefore may be used in combination with a light emitting apparatus that emits ultraviolet ray (ultraviolet ray emitter). Also because the coating layer with the fluorescent substance bound therein having the wavelength converting function can be formed on the entire surfaces of the light emitting device, namely on the top surface, side faces and on corners with the same thickness, the fluorescent substance is distributed uniformly over the entire surfaces of the light emitting device. Thus it is made possible to convert the wavelength of light emitted from the entire surfaces of the nitride semiconductor light emitting device, namely from the top surface, side faces and corners thereof and extract the converted light to the outside with very high efficiency.

With the prior art constitution where the fluorescent substance is dispersed in a resin, in contrast, the device cannot endure a long period of use due to deterioration of most resin when exposed to blue light or ultraviolet ray, and it has been difficult to make a white light emitting apparatus that is practically useful by using a light emitting device that emits light in ultraviolet region. Also because it has been impossible in the prior art to form the coating layer wherein the fluorescent substance is bound with $SiO_2$ that contains a fluorescent substance having wavelength converting function on the entire surfaces of the light emitting device, namely on the top surface, side faces and on corners with the same thickness, the fluorescent substance cannot be distributed uniformly over the entire surfaces of the light emitting device. Therefore it has been difficult to convert the wavelength of light emitted from the entire surfaces of the nitride semiconductor light emitting device and extract the converted light to the outside with very high efficiency.

[Fluorescent Substance]

The fluorescent substance used in the present invention is for the purpose of converting visible light or ultraviolet ray emitted by the light emitting device to light of other wavelength.

Any fluorescent substance that can be excited by the light emitted by the semiconductor light emitting layer of the LED chip 101 and emit light can be used in the present invention. In this embodiment, such a fluorescent substance may also be used that is excited by ultraviolet ray and emit light of a predetermined color, such as:

(1) $Ca_{10}(PO_4)_6FCl$: Sb, Mn
(2) $M_5(PO_4)_3Cl$: Eu (M represents at least one element selected from among Sr, Ca, Ba, Mg)
(3) $BaMg_2Al_{16}O_{27}$: Eu
(4) $BaMg_2Al_{16}O_{27}$: Eu, Mn
(5) $3.5MgO.0.5MgF_2.GeO_2$: Mn
(6) $Y_2O_2S$: Eu
(7) $Mg_6As_2O_{11}$: Mn
(8) $Sr_4Al_{14}O_{25}$: Eu
(9) (Zn, Cd)S: Cu
(10) $SrAl_2O_4$: Eu
(11) $Ca_{10}(PO_4)_6ClBr$: Mn, Eu
(12) $Zn_2GeO_4$: Mn
(13) $Gd_2O_2S$: Eu, and
(14) $La_2O_2S$: Eu These fluorescent substances may be used either individually or in combination by mixing two or more thereof, in the coating layer consisting of a single layer. These fluorescent substances may also be used either individually or in combination by mixing two or more thereof, in the coating layer consisting of two or more layers stacked one on another.

In case light emitted by the LED chip 101 and light emitted by the fluorescent substance are in the relation of complementary colors of each other, white light can be generated by blending the light from both sources. Specifically, light emitted by the LED chip 101 and light emitted by the fluorescent substances that are excited by the LED light may have three primary colors (red, green and blue), or the LED chip 101 may emit blue light while the fluorescent substances excited by the LED emitting yellow light.

Color of light emitted by the light emitting apparatus can be controlled through the selection of such factors as the proportion of fluorescent substance and other materials containing resin and inorganic material such as glass that serve as the binder for the fluorescent substance, precipitation time of the fluorescent substance, shape of the fluorescent substance and wavelength of light emitted by the LED chip, thereby to provide white light of desired tone such as that of incandescent lamp. It is preferable that light emitted by the LED chip 101 and light emitted by the fluorescent substance can transmit through a molding member efficiently.

Specifically for the fluorescent substance, cadmium zinc sulfide activated with copper or yttrium aluminum garnet-based fluorescent substance activated with cerium may be used. For applications that require high luminance and long operation time, $(Re_{1-x}Sm_x)_3(Al_{1-y}Ga_y)_5O_{12}$:Ce ($0 \leq x < 1$, $0 \leq y \leq 1$, where Re is at least one element selected from among Y, Gd and La) is preferably used.

The $(Re_{1-x}Sm_x)_3(Al_{1-y}Ga_y)_5O_{12}$:Ce fluorescent substance has garnet structure, and is therefore resistant to heat, light and moisture, and is capable of absorbing light with excitation spectrum having a peak around 470 nm. It can also emit light with a broad emission spectrum having a peak near 530 nm tailing to 720 nm.

In the light emitting apparatus of the present invention, two or more kinds of fluorescent substance may be used in combination. For example, two or more kinds of $(Re_{1-x}Sm_x)_3(Al_{1-y}Ga_y)_5O_{12}$:Ce fluorescent substance containing Al, Ga, Y, La, Gd or Sm in different proportions may be mixed so as to increase the R, G and B components of light. As semiconductor light emitting devices currently in use may involve variations in the wavelength of light emitted thereby, two or more kinds of fluorescent substance may be mixed so as to emit blended light having desired tone of white. Specifically, light of desired color corresponding to a point determined by the combination of the fluorescent substance and the light emitting device in chromaticity diagram can be emitted, by adjusting the quantities of fluorescent substances having different values of chromaticity in accordance to the wavelength of light emitted by the light emitting device.

Such a fluorescent substance can be dispersed uniformly in gas phase or liquid phase. The fluorescent substance in gas phase or liquid phase precipitates by the gravity. Particularly in liquid phase, a layer containing the fluorescent substance distributed therein more uniformly can be formed by leaving the suspension to stand still. A layer containing a desired amount of fluorescent substance can be formed by repeating this operation.

Either two or more kinds of fluorescent substance may be contained in the coating layer constituted from a single layer, or one or more kinds of fluorescent substance may be contained in each of two layers that constitute the coating layer. This constitution enables it to obtain white light through blending of light emitted by the different fluorescent substances. In this case, it is preferable that the different fluorescent substances have similar mean particle sizes and shapes, in order to satisfactorily blend light from the different fluorescent substances and reduce color unevenness. In the present specification, particle size refers to a value determined from volumetric particle size distribution curve. The volumetric particle size distribution curve is determined from particle size distribution measured by laser diffraction and diffusion method. Specifically, the material in question is dispersed in 0.05% aqueous solution of sodium hexametaphosphate at ambient temperature of 25° C. and humidity of 70%, and the particle size distribution is measured in a range from 0.03 to 700 μm with laser diffraction particle size distribution measuring instrument (SALD-2000A).

According to this embodiment, yttrium aluminum garnet-based fluorescent substance and a fluorescent substance capable of emitting red light, particularly nitride fluorescent substance, may be used in combination. The YAG fluorescent substance and the nitride fluorescent substance may be either mixed and contained in the coating layer, or separately contained in different layers of composite coating layer. The fluorescent substances will be described in more detail below.

(Yttrium Aluminum Garnet-Based Fluorescent Substance)

The yttrium aluminum garnet-based fluorescent substance used in this embodiment is a fluorescent substance containing Y and Al, at least one element selected from among Lu, Sc, La, Gd, Tb, Eu and Sm, at least one element selected from among Ga and In, and is activated with at least one element selected from among rare earth elements, so as to be excited by visible light or ultraviolet ray emitted by the LED chip 101 and emit light of other wavelength. Particularly in this embodiment, two or more kinds of yttrium aluminum oxide-based fluorescent substance that are activated with Ce or Pr and have different compositions are also used. White light of desired color tone can be produced by mixing blue light emitted by the light emitting device that uses nitride compound semiconductor in the light emitting layer thereof, with green light and red light emitted by the fluorescent substance having yellow body color so as to absorb blue light, or with greenish yellow color and reddish yellow color. In order to achieve such a color blending, the fluorescent substance in powder or bulk is mixed in a resin such as epoxy resin, acrylic resin or silicone resin, or in a light transmitting inorganic material such as silicon oxide or aluminum oxide. Such a material containing a fluorescent substance can be formed in various shapes such as dots or layer that is thin enough to allow transmission of light emitted by the LED chip, according to the application. Light of desired color tone can be generated through the selection of such factors as the proportion of fluorescent substance and the light transmitting inorganic material, conditions and quantity of inclusion of the fluorescent substance and wavelength of light emitted by the light emitting device, thereby to provide white light of desired tone such as that of incandescent lamp.

The light emitting apparatus capable of emitting light with high efficiency can be made by disposing two or more kinds of fluorescent substance so as to receive the light emitted by the light emitting device sequentially. That is, when a color conversion member that absorbs light in long wavelength region and emits light in long wavelength region and a color conversion member that absorbs light in longer wavelength region and emits light in longer wavelength region are formed one on another on the light emitting device having a reflector member, so that the reflected light can be effectively used.

Use of the YAG fluorescent substance makes it possible to make such a light emitting apparatus having sufficient level of light fastness even when placed in contact with or in the vicinity of an LED chip that emits light with illuminance (Ee) in a range from 0.1 W·cm$^{-2}$ to 1000 W·cm$^{-2}$.

The yttrium aluminum oxide-based fluorescent substance activated with cerium that is used in this embodiment and is capable of emitting green light has garnet structure, and is therefore resistant to heat, light and moisture, and is capable of absorbing light with excitation spectrum having a peak wavelength in a region from 420 nm to around 470 nm. It can also emit light with a broad emission spectrum having a peak wavelength $\lambda p$ near 510 nm tailing to near 700 nm.

On the other hand, the yttrium aluminum oxide-based fluorescent substance activated with cerium that is capable of emitting red light has garnet structure, and is therefore resistant to heat, light and moisture, and is capable of absorbing light with absorption spectrum having a peak wavelength in a region from 420 nm to around 470 nm. It can also emit light with a broad emission spectrum having a peak wavelength $\lambda p$ near 600 nm tailing to near 750 nm.

In the compositions of YAG fluorescent substance that have garnet structure, substituting a portion of Al atoms with Ga causes the emission spectrum to shift toward shorter wavelength, and substituting a portion of Y with Gd and/or La causes the emission spectrum to shift toward longer wavelength. Color of emitted light can be changed continuously by controlling the composition. Therefore, ideal conditions are provided for converting blue light emitted by the nitride semiconductor into white light such as the capability of changing the light intensity of long wavelengths by means of the proportion of Gd. When less than 20% of Y atoms are substituted, green component increases and red component decreases. When more than 80% of Y atoms are substituted, red component increases but luminance decreases sharply. As for the excitation absorption spectrum, too, in the compositions of YAG fluorescent substance that have garnet structure, substituting a portion of Al atoms with Ga causes the excitation absorption spectrum to shift toward shorter wavelength, and substituting a portion of Y with Gd and/or La causes the excitation absorption spectrum to shift toward longer wavelength. Peak wavelength of the excitation absorption spectrum of the YAG fluorescent substance is preferably on the shorter wavelength side of the peak wavelength of the emission spectrum of the light emitting device. When current input to the light emitting device is increased in this constitution, peak wavelength of the excitation absorption spectrum substantially corresponds to the peak wavelength of the emission spectrum of the light emitting device, and therefore the light emitting apparatus that minimizes the chromatic deviation can be made without decreasing the excitation efficiency of the fluorescent substance.

Such a fluorescent substance is made by using oxides of Y, Gd, Ce, La, Al, Sm and Ga or compounds that can be easily turned into the oxides at a high temperature and mixing these materials in stoichiometrical proportions. Alternatively, coprecipitation of a solution of rare earth elements such as Y, Gd, Ce, La, Al, Sm in oxalic acid in stoichiometrical proportions may be fired and mixed with aluminum oxide and gallium oxide, thereby to obtain a mixture of stock material. A fluoride such as ammonium fluoride is added as a flux to this material, that is then put into a crucible and fired in air at a temperature in a range from 1350 to 1450° C. for 2 to 5 hours, thereby to obtain calcined material. Then the calcined material is subjected to ball-mill process in water, washing, separation, drying and sieving, thereby to obtain the fluorescent substance. According to a method of manufacturing fluorescent substance of another embodiment, a mixture of stock materials for the fluorescent substances with a flux added thereto is preferably fired in two stages; a first firing process carried out in air atmosphere or weakly reducing atmosphere, and a second firing process carried out in reducing atmosphere. The weakly reducing atmosphere refers to an atmosphere containing oxygen in such a concentration that is required at least for the reaction of producing the fluorescent substance from the stock material of mixture. By carrying out the first firing process till the desired structural formation of the fluorescent substance is completed in the weakly reducing atmosphere, blackening deterioration of the fluorescent substance and decrease in the efficiency of absorbing light can be prevented from occurring. The reducing atmosphere used in the second firing process refers to an atmosphere having higher reducing power than the weakly reducing atmosphere. Firing in this 2-step process enables it to obtain fluorescent substances having high efficiency of absorbing light of the excitation wavelength. As a result, quantity of the fluorescent substance required to produce the desired color tone can be decreased and the light emitting apparatus having high efficiency of extracting light can be made in this process.

Two or more kinds of yttrium aluminum oxide-based fluorescent substance activated with cerium having different compositions may be either used in a mixture or disposed separately. When the fluorescent substances are placed separately, it is preferable to place the fluorescent substance that absorbs light of shorter wavelength emitted by the light emitting device is placed first, and the fluorescent substance that absorbs light of longer wavelength emitted by the light emitting device is placed next. This configuration makes it possible to absorb and emit light with high efficiency.

(Nitride-Based Fluorescent Substance)

The fluorescent substance used in the present invention contains N and also contains at least one element selected from among Be, Mg, Ca, Sr, Ba and Zn and at least one element selected from among C, Si, Ge, Sn, Ti, Zr and Hf, and is activated with at least one element selected from among rare earth elements. The nitride-based fluorescent substances used in this embodiment refer to fluorescent substances that are excited by visible light or ultraviolet ray emitted from the LED chip 101 and light emitted from the YAG fluorescent substance and emit light. For example, there can be manufactured various fluorescent substances such as Ca—Ge—N: Eu, Z, Sr—Ge—N: Eu, Z, Sr—Ca—Ge—N: Eu, Z, Ca—Ge—O—N: Eu, Z, Sr—Ge—O—N: Eu, Z, Sr—Ca—Ge—O—N: Eu, Z, Ba—Si—N: Eu, Z, Sr—Ba—Si—N: Eu, Z, Ba—Si—O—N: Eu, Z, Sr—Ba—Si—O—N: Eu, Z, Ca—Si—C—N: Eu, Z, Sr—Si—C—N: Eu, Z, Sr—Ca—Si—C—N: Eu,Z, Ca—Si—C—O—N: Eu, Z, Sr—Si—C—O—N: Eu, Z, Sr—Ca—Si—C—O—N: Eu, Z, Mg—Si—N: Eu, Z, Mg—Ca—Sr—Si—N: Eu, Z, Sr—Mg—Si—N: Eu, Z, Mg—Si—O—N: Eu, Z, Mg—Ca—Sr—Si—O—N: Eu, Z, Sr—Mg—Si—O—N: Eu, Z, Ca—Zn—Si—C—N: Eu, Z, Sr—Zn—Si—C—N: Eu, Z, Sr—Ca—Zn—Si—C—N: Eu, Z, Ca—Zn—Si—C—O—N: Eu, Z, Sr—Zn—Si—C—O—N: Eu, Z, Sr—Ca—Zn—Si—C—O—N: Eu, Z, Mg—Zn—Si—N: Eu, Z, Mg—Ca—Zn—Sr—Si—N: Eu, Z, Sr—Zn—Mg—Si—N: Eu, Z, Mg—Zn—Si—O—N: Eu, Z, Mg—Ca—Zn—Sr—Si—O—N: Eu, Z, Sr—Mg—Zn—Si—O—N: Eu, Z, Ca—Zn—Si—Sn—C—N: Eu, Z, Sr—Zn—Si—Sn—C—N: Eu, Z, Sr—Ca—Zn—Si—Sn—C—N: Eu, Z, Ca—Zn—Si—Sn—C—O—N: Eu, Z, Sr—Zn—Si—Sn—C—O—N: Eu, Z, Sr—Ca—Zn—Si—Sn—C—O—N: Eu, Z, Mg—Zn—Si—Sn—N: Eu, Z, Mg—Ca—Zn—Sr—Si—Sn—N: Eu, Z, Sr—Zn—Mg—Si—Sn—N: Eu, Z, Mg—Zn—Si—Sn—O—N: Eu, Z, Mg—Ca—Zn—Sr—Si—Sn—O—N: Eu, Z, and Sr—Mg—Zn—Si—Sn—O—N: Eu, Z. Z as the rare-earth element preferably contains at least one element selected from among Y, La, Ce, Pr, Nd, Gd, Tb, Dy, Ho, Er and Lu, and may contain Sc, Sm, Tm and Yb. These rare-earth elements are mixed with the starting material alone, or oxide, imide or amide. These rare-earth elements mainly have a stable trivalent electron configuration, while Yb and Sm have a divalent electron configuration and Ce, Pr and Tb have a tetravalent electron configuration. When using the rare-earth element in the form of oxide, participation of oxygen exerts an influence on light emission characteristic. Namely, oxygen sometimes causes the luminance of emitted light. To the contrary, oxygen has a merit of suppressing afterglow. When using Mn, the particle size can be increased by the effect of Mn and O as a flux, thereby to improve the luminance of emitted light.

For example, La is used as a co-activating agent. Lanthanum oxide ($La_2O_3$) is a white crystal and is quickly converted into a carbonate when allowed to stand in an air. Therefore, it is stored in an inert gas atmosphere.

For example, Pr is used as a co-activating agent. Unlike a conventional rare earth oxide $Z_2O_3$, pseodymium oxide ($Pr_6O_{11}$) is a non-stoichiometric oxide and turns into a black powder with the composition of $Pr_6O_{11}$ when heated oxalate, hydroxide or carbonate of praseodymium to about 800° C. in an air. $Pr_6O_{11}$ is used as a starting material for the synthesis of a praseodymium compound and a high-purity product is commercially available.

The fluorescent substances of the present invention include Sr—Ca—Si—N: Eu, Ca—Si—N: Eu, Sr—Si—N: Eu, Sr—Ca—Si—O—N: Eu, Ca—Si—O—N: Eu and Sr—Si—O—N: Eu silicon nitrides containing Mn added therein. The fundamental constituent element of these fluorescent substances is represented by the general formula: $L_XSi_YN_{(2/3X+4/3Y)}$: Eu or $L_XSi_YO_ZN_{(2/3X+4/3Y-2/3Z)}$: Eu (L represents Sr and/or Ca). In the general formula, X and Y are preferably as follows: X=2, Y=5, or X=1, Y=7. Any fluorescent substance can be used. For example, there can be preferably used fluorescent substances whose fundamental constituent element is represented by $(Sr_XCa_{1-X})_2Si_5N_8$: Eu, $Sr_2Si_5N_8$: Eu, $Ca_2Si_5N_8$: Eu, $Sr_XCa_{1-X}Si_7N_{10}$: Eu, $SrSi_7N_{10}$: Eu and $CaSi_7N_{10}$: Eu containing Mn added therein. These fluorescent substances may contain at least one element selected from among Mg, Sr, Ca, Ba, Zn, B, Al, Cu, Mn, Cr and Ni. The present invention is not limited to these embodiments and examples.

L is Sr and/or Ca. A mixing ratio of Sr and Ca can be optionally replaced.

A cheap fluorescent substance having good crystallinity can be provided by using Si in the fluorescent substance.

As a luminescence center, europium Eu as a rare-earth element is used. Mainly, europium has divalent and trivalent energy levels. In the fluorescent substance of the present invention, $Eu^{2+}$ is used as an activating agent to an alkali earth metal-based silicon nitride as a base. $Eu^{2+}$ is easily oxidized and is commercially available in the form of trivalent $Eu_2O_3$. However, because of large participation of O in commercially available $Eu_2O_3$, good fluorescent substance is not easily obtained. Therefore, it is preferred to use those wherein O is removed from $Eu_2O_3$. For example, it is preferred to use europium alone or europium nitride, with the exception of the case of adding Mn.

Examples of the manufacturable fluorescent substance include, but are not limited to, $Sr_2Si_5N_8$: Eu, Pr, $Ba_2Si_5N_8$: Eu, Pr, $Mg_2Si_5N_8$: Eu, Pr, $Zn_2Si_5N_8$: Eu, Pr, $SrSi_7N_{10}$: Eu, Pr, $BaSi_7N_{10}$: Eu, Ce, $MgSi_7N_{10}$: Eu, Ce, $ZnSi_7N_{10}$: Eu, Ce, $Sr_2Ge_5N_8$: Eu, Ce, $Ba_2Ge_5N_8$: Eu, Pr, $Mg_2Ge_5N_8$: Eu, Pr, $Zn_2Ge_5N_8$: Eu, Pr, $SrGe_7N_{10}$: Eu, Ce, $BaGe_7N_{10}$: Eu, Pr, $MgGe_7N_{10}$: Eu, Pr, $ZnGe_7N_{10}$: Eu, Ce, $Sr_{1.8}Ca_{0.2}Si_5N_8$: Eu, Pr, $Ba_{1.8}Ca_{0.2}Si_5N_8$: Eu, Ce, $Mg_{1.8}BCa_{0.2}Si_5N_8$: Eu, Pr, $Zn_{1.8}Ca_{0.2}Si_5N_8$: Eu, Ce, $Sr_{0.8}Ca_{0.2}Si_7N_{10}$: Eu, La, $Ba_{0.8}Ca_{0.2}Si_7N_{10}$: Eu, La, $Mg_{0.8}Ca_{0.2}Si_7N_{10}$: Eu, Nd, $Zn_{0.8}Ca_{0.2}Si_7N_{10}$: Eu, Nd, $Sr_{0.8}Ca_{0.2}Ge_7N_{10}$: Eu, Tb, $Ba_{0.8}Ca_{0.2}Ge_7N_{10}$: Eu, Tb, $Mg_{0.8}Ca_{0.2}Ge_7N_{10}$: Eu, Pr, $Zn_{0.8}Ca_{0.2}Ge_7N_{10}$: Eu, Pr, $Sr_{0.8}Ca_{0.2}Si_6GeN_{10}$: Eu, Pr, Ba$_{0.8}$Ca$_{0.2}$Si$_6$GeN$_{10}$: Eu, Pr, Mg$_{0.8}$Ca$_{0.2}$Si$_6$GeN$_{10}$: Eu, Y, Zn$_{0.8}$Ca$_{0.2}$Si$_6$GeN$_{10}$: Eu, Y, Sr$_2$Si$_5$N$_8$: Pr, Ba$_2$Si$_5$N$_8$: Pr, Sr$_2$Si$_5$N$_8$: Tb, and BaGe$_7$N$_{10}$: Ce.

Addition of Mn accelerates the diffusion of Eu$^{2+}$, and improves the luminance of emitted light, energy efficiency and quantum efficiency. Mn may be added to the stock material during preparation or, alternatively, Mn or a compound of Mn may be added during the manufacturing process before firing together with the stock material. However, the resultant material after firing does not contain Mn or contains far smaller amount of Mn than initially added. This is supposedly because Mn was dispersed and lost in the firing process.

The fluorescent substance contains one or more element selected from the group consisting of Mg, Ga, In, Li, Na, K, Re, Mo, Fe, Sr, Ca, Ba, Zn, B, Al, Cu, Mn, Cr, O and Ni, as well as the fundamental constituent elements. These elements have such effects as increasing the particle size and improving the luminance of emitted light. B, Al, Mg, Cr and Ni have the effect of suppressing afterglow.

Such a nitride-based fluorescent substance absorbs at least a portion of blue light emitted by the LED chip 101 and emits light in a region from yellow to red. The nitride-based fluorescent substance and the YAG fluorescent substance are used together in the light emitting device having the constitution described above, so as to provide the light emitting device that emits white light of warm color tone by blending blue light emitted by the LED chip 101 and light of a color in the region from yellow to red emitted by the nitride fluorescent substance. The fluorescent substance used in addition to the nitride fluorescent substance preferably contains yttrium aluminum oxide-based fluorescent substance activated with cerium. Addition of the yttrium aluminum oxide-based fluorescent substance makes it possible to control the chromaticity to a desired value. The yttrium aluminum oxide-based fluorescent substance activated with cerium absorbs a portion of blue light emitted by the LED chip 101 and emits light in yellow region. The blue light emitted by the LED chip 101 and the yellow light emitted by the yttrium aluminum oxide-based fluorescent substance are blended to produce bluish white light. Therefore, the light emitting apparatus that emits blended light of whitish color by blending blue light emitted by the LED chip 101 can be made by mixing the yttrium aluminum oxide-based fluorescent substance and the fluorescent substance that emits red light in the coating member 101 having translucence. Particularly preferable is a light emitting apparatus that emits light of color having chromaticity located on the locus of black body radiation in the chromaticity diagram. It is also possible to adjust the amount of fluophor in the yttrium aluminum oxide fluorescent substance and the fluophor that emits red light, so as to provide a light emitting apparatus that emits light of a desired color temperature. This light emitting apparatus that emits blended light of whitish color improves the special color rendering performance number R9. In the light emitting apparatus that emits white light constituted from only the combination of a blue light emitting device of the prior art and yttrium aluminum oxide fluorescent substance activated with cerium has special color rendering performance number R9 of almost zero at color temperature around Tcp=4600K, indicating deficiency in red component. Accordingly it has been called for to improve the special color rendering performance number R9. According to the present invention, the special color rendering performance number R9 can be increased to near 40 at color temperature around Tcp=4600K by using the fluorescent substance that emits red light together with the yttrium aluminum oxide fluorescent substance.

The method of manufacturing the fluorescent substance ((Sr$_X$Ca$_{1-X}$)$_2$Si$_5$N$_8$: Eu) of the present invention will be described, but is not limited thereto. The above fluorescent substance contains Mn and O.

Sr and Ca as the staring material are crushed. Although Sr and Ca as the staring material are preferably used alone, compounds such as compound and amide compound can also be used. Sr and Ca as the staring material may contain B, Al, Cu, Mg, Mn, MnO, Mn$_2$O$_3$ and Al$_2$O$_3$. Sr and Ca as the staring material are crushed in a glove box in an argon atmosphere. Sr and Ca powders obtained by crushing preferably have a mean particle diameter of about 0.1 to 15 μm, but are not limited thereto. Sr and Ca preferably have purity of 2N or higher, but are not limited thereto. To improve the mixed state, at least one of metallic Ca, metallic Sr and metallic Eu can be used as a starting material after forming into an alloy and nitriding the alloy and pulverizing.

Si as the starting material is crushed. Although Si as the starting material is preferably used alone, a nitride compound, an imide compound and an amide compound can also be used. Examples thereof include Si$_3$N$_4$, Si(NH$_2$)$_2$ and Mg$_2$Si. Si as the starting material preferably has purity of 3N or higher, but may contain compounds such as Al$_2$O$_3$, Mg, metal boride (CO$_3$B, Ni$_3$B, CrB), manganese oxide, H$_3$BO$_3$, B$_2$O$_3$, Cu$_2$O and CuO. Similar to Sr and Ca as the starting material, Si is crushed in a glove box in an argon atmosphere or a nitrogen atmosphere. The Si compound preferably has a mean particle diameter in a range from 0.1 to 15 μm.

Then, Sr and Ca as the starting material are nitrided in a nitrogen atmosphere. Each reaction scheme is shown in the following formulas 1 and 2.

$$3Sr+N_2 \rightarrow Sr_3N_2 \quad (1)$$

$$3Ca+N_2 \rightarrow Ca_3N_2 \quad (2)$$

Sr and Ca are nitrided in a nitrogen atmosphere at 600 to 900° C. for about 5 hours. Sr and Ca may be mixed and then nitrided, or may be nitrided separately. Consequently, a nitride of Sr and Ca can be obtained. Although the nitride of Sr and Ca preferably has high purity, a commercially available product can also be used.

Si as the starting material is nitrided in a nitrogen atmosphere. This reaction scheme is shown in the following formula 3.

$$3Si+2N_2 \rightarrow Si_3N_4 \quad (3)$$

Silicon Si is nitrided in a nitrogen atmosphere at 800 to 1200° C. for about 5 hours. Consequently, silicon nitride is obtained. Although silicon nitride used in the present invention preferably has high purity, a commercially available product can also be used.

Sr, Ca or a Sr—Ca nitride is crushed. Sr, Ca or a Sr—Ca nitride is crushed in a glove box in an argon atmosphere or nitrogen atmosphere.

Similarly, a nitride of Si is crushed. Similarly, Eu$_2$O$_3$ as a compound of Eu is crushed. Although europium oxide is used as the compound of Eu, metallic europium and europium nitride can also be used. In addition, an imide compound and an amide compound can also be used for Z as the starting material. Although the europium oxide preferably has high purity, a commercially avaijable product can also be used. After crushing, the nitride, silicon nitride and europium oxide of the alkali earth metal preferably have a mean particle diameter in a range from about 0.1 to 15 μm.

The above starting materials may contain at least one element selected from the group consisting of Mg, Sr, Ca, Ba, Zn, B, Al, Cu, Mn, Cr, O and Ni. Also the above elements such as Mg, Zn and B can be mixed in a controlled quantity in the following mixing process. These compounds can be added alone in the starting materials, but are usually added in the form of a compound. Examples of the compound include $H_3BO_3$, $Cu_2O_3$, $MgCl_2$, $MgO.CaO$, $Al_2O_3$, metal boride (CrB, $Mg_3B_2$, $AlB_2$, MnB), $B_2O_3$, $Cu_2O$ and CuO.

After the completion of crushing, Sr, Ca, a Sr—Ca nitride a nitride of Si, and $Eu_2O_3$ as a compound of Eu are mixed and Mn is added to the mixture. Since the mixture is easily oxidized, mixing is conducted in a glove box in an Ar atmosphere or a nitrogen atmosphere.

Finally, the mixture of Sr, Ca, a Sr—Ca nitride a nitride of Si, and $Eu_2O_3$ as a compound of Eu is fired in an ammonia atmosphere. A fluorescent substance represented by $(Sr_xCa_{1-x})_2Si_5N_8$: Eu containing Mn added therein can be obtained by firing. The reaction scheme of the fundamental constituent element by means of firing is shown below.

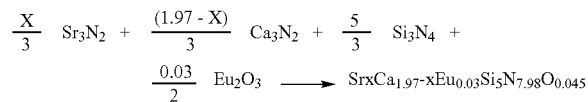

The composition of the objective fluorescent substance can be replaced by changing the mixing ratio of the respective starting materials.

Firing can be effected by using a tubular furnace, a small-sized furnace, a high frequency furnace or a metal furnace. Firing can be effected at a firing temperature in a range from 1200 かち1700° C., and more preferably from 1400 to 1700° C. Firing is preferably effected by using a single-stage firing process of firing at a temperature in a range from 1200 to 1500° C. for several hours after gradually heating, and can also be conducted by using a second-stage firing (multi-stage firing) process comprising a first-stage firing at a temperature in a range from 800 to 1000° C. and a second-stage firing at a temperature in a range from 1200 to 1500° C. after gradually heating. The starting materials of the fluorescent substance are preferably fired using a crucible or boat made of boron nitride (BN). In addition to the crucible made of boron nitride, a crucible made of a alumina ($Al_2O_3$) can also be used.

The desired fluorescent substance can be made by employing the manufacturing method described above.

In this embodiment of the present invention, a nitride-based fluorescent substance is used as the fluorescent substance that emits reddish light. According to the present invention, the light emitting apparatus having the YAG fluorescent substance and a fluorescent substance capable of emitting light of reddish color may also be made. Fluorescent substances capable of emitting light of reddish color are those which are excited by light of wavelength in a range from 400 to 600 nm and emits light, for example, $Y_2O_2S$: Eu, $La_2O_2S$: Eu, CaS: Eu, SrS: Eu, ZnS: Mn, ZnCdS: Ag, Al, ZnCdS: Cu, Al and so on. By using such a fluorescent substance capable of emitting light of reddish color together with the YAG fluorescent substance, color rendering performance of the light emitting apparatus can be improved.

[Adhesive Layer 110]

The adhesive layer 110 used in this embodiment is an inorganic material layer formed by placing the light emitting device on the supporting body via an organic material in the state of sol and heating to dry. Moreover, the adhesive layer of the present invention is colorless transparent layer that continuously exists between the top surface of the supporting body and the bottom surface of the light emitting device and extends over the side faces of the light emitting device.

Due to the reflection on the package and other surface, light of high energy emitted by the LED chip fills the adhesive layer with high density. When a nitride-based semiconductor that is capable of emitting light of high intensity with high energy is used as the LED chip, it is preferable to use an oxide containing at least one element selected from the group consisting of Si, Al, Ga, Ti, Ge, P, B, Zr, Y, Sn, Pb and alkali earth metals that is durable to light of high energy as the adhesive solution provided between the light emitting device and the supporting body.

As the major material to make the adhesive layer, a light transmitting inorganic material such as $SiO_2$, $Al_2O_3$, $ZrO_2$, $Y_2O_3$ or $MSiO_3$ (M represents such an element as Zn, Ca, Mg, Ba, Sr) is preferably used. The bottom surface of the light emitting device and the top surface of the supporting body are put against each other via the light transmitting inorganic material so as to fasten the light emitting device onto the supporting body. According to the present invention, the oxide containing at least one element selected from the group consisting of Si, Al, Ga, Ti, Ge, P, B, Zr, Y, Sn, Pb and alkali earth metals is produced from organometallic compound similarly to the material used to form the coating layer. When such an organometallic compound that is in liquid phase at an ordinary temperature is used, the viscosity can be controlled for better workability and solidification of the organometallic compound can be prevented by adding an organic solvent, thereby to improve the workability. Since such an organometallic compound can easily undergo chemical reaction such as hydrolysis and produce inorganic substances such as oxide and hydroxide, the adhesive layer can be easily formed without compromising the performance of the LED to emit light by means of the oxide containing at least one element selected from the group consisting of Si, Al, Ga, Ti, Ge, P, B, Zr, Y, Sn, Pb and alkali earth metals. Also in case the adhesive layer extends over the side faces of the light emitting device, die bonding of the metallic solder may result in metals that absorb light emitted by the light emitting device in a region from near ultraviolet to blue being contained in the metal solder. When the light emitting device is die-bonded with Au—Sn eutectic solder, for example, Au absorbs light emitted by the light emitting device in a region from near ultraviolet to blue, leading to a decrease in the output power of the light emitting apparatus. The adhesive layer of the present invention, in contrast, does not absorb light emitted by the light emitting device in a region from near ultraviolet to blue, and therefore enables it to make the light emitting apparatus having a high efficiency of light emission.

Now $SiO_2$, $Al_2O_3$ as major component of the adhesive layer will be described below.

(Adhesive Layer Using $SiO_2$)

The adhesive layer based on $SiO_2$ is formed in such a process: silica sol adhesive solution prepared by mixing an alkyl silicate and an organic solvent having high boiling point in predetermined proportions is applied to a predetermined position on the surface of the supporting body by stamping or dispensing, then the bottom surface of the light emitting device is put onto the surface of the supporting body via the silica sol and is heated so as to solidify the $SiO_2$ component. Stamping refers to such a process as the distal end of an application needle is pressed against the adhesive solution, then the distal end of the application needle having the adhesive solution deposited thereon is moved to a position right above a predetermined position on the surface of the supporting body and is pressed against the surface of the supporting body, thereby applying the adhesive solution to the predetermined position on the surface of the supporting body. Dispensing refers to such a method as the adhesive solution that fills a cylinder of a die bonding material supply apparatus is discharged by means of either a piston or air pressure so as to deliver a specified amount of the adhesive solution to the predetermined position on the surface of the supporting body.

As described above, the hydrolysis reaction of ethyl silicate proceeds faster as the temperature is higher, and proceeds even faster when the product ethanol is removed. When a gel produced through the hydrolysis reaction of ethyl silicate is heated, $SiO_2$ of mainly amorphous state is generated. Therefore, a hydrolysate solution of ethyl silicate in gel state is applied to the supporting body by stamping or dispensing, then the bottom surface of the light emitting device is put onto the surface of the supporting body via the adhesive solution and is heated so as to make the light emitting apparatus having the light emitting device bonded onto the surface of the supporting body by means of $SiO_2$. Particularly in this embodiment, ethyl silicate is prepared as a hydrolysate solution in the state of sol having high viscosity, and the hydrolysate solution is applied to a predetermined position on the surface of the supporting body by stamping or dispensing, then the light emitting device is pressed from above so as to be die-bonded, thereby causing the adhesive solution to extend over the side faces of the light emitting device. As a result, the light emitting device will not be displaced from the position where it has been placed and is secured onto the supporting body by the $SiO_2$ that is formed by heating the adhesive solution. In the prior art, since ethyl silicate contains much moisture before being turned into sol, there have been such problems as the light emitting device is dislocated due to flow of the adhesive solution or surface condition of the light emitting device deteriorates due to moisture before heating, thus giving an adverse effect on the optical characteristic of the light emitting device. According to the method of this embodiment, the hydrolysate solution of ethyl silicate in the state of sol hardly contains moisture and produces mainly amorphous $SiO_2$ simply by heating. Therefore, the adhesive layer based on $SiO_2$ can be easily formed so as to fasten the light emitting device onto the supporting body without causing displacement of die bonding position and deterioration of the optical characteristic of the light emitting device. Also the adhesive layer based on $SiO_2$ formed by the adhesive solution extending over the side faces of the light emitting device and the coating layer wherein the fluorescent substance is bound with $SiO_2$ that is formed on the light emitting device later join with each other on the side faces of the light emitting device. These layers are made of the same organometallic compound as the starting material and therefore contains much components of the same kind so as to bond with each other satisfactorily. Therefore, the adhesive layer based on $SiO_2$ formed by the adhesive solution extending over the side faces of the light emitting device prevents the coating layer from peeling off the light emitting device thereby to make the light emitting apparatus having high reliability.

(Adhesive Layer Based on $Al_2O_3$)

The adhesive layer based on $Al_2O_3$ can be formed in such a process as: alumina sol is prepared by mixing aluminum alcoholate or aluminum alkoxide and an organic solvent having high boiling point in predetermined proportions to make the adhesive solution, that is applied to the predetermined position of the supporting body by stamping or dispensing, then the bottom surface of the light emitting device is put onto the surface of the supporting body via the alumina sol so as to turn the $Al_2O_3$ component into amorphous state.

As described above, aluminum isopropoxide easily reacts with water and turns into aluminum hydroxide or alumina as the final product.

Therefore, the light emitting apparatus can be made by having aluminum isopropoxide react with water contained in air that is then applied to the supporting body as the adhesive solution by stamping or dispensing, then the bottom surface of the light emitting device is put onto the surface of the supporting body via the adhesive solution and is heated so as to make the light emitting apparatus having the light emitting device bonded onto the surface of the supporting body by means of $Al_2O_3$. Also the adhesive layer based on $Al_2O_3$ formed by the adhesive solution extending over the side faces of the light emitting device and the coating layer wherein fluorescent substance is bound with $Al_2O_3$ that is formed later on the light emitting device join with each other on the side faces of the light emitting device. These layers are made of the same organometallic compound as the starting material and therefore contain much components of the same kind so as to bond with each other satisfactorily. Therefore, the adhesive layer based on $Al_2O_3$ formed by the adhesive solution extending over the side faces of the light emitting device prevents the coating layer from peeling off the light emitting device thereby to make the light emitting apparatus having high reliability.

The adhesive layer based on $SiO_2$ and the adhesive layer based on $Al_2O_3$ described above are bonding formed by using inorganic material unlike the conventional bonding that uses resin, and as such are far less likely to deteriorate due to exposure to ultraviolet ray, with the bonding strength maintained without decreasing even when used in combination with a light emitting device that emits light including wavelength shorter than that of blue light or a light emitting device that emits ultraviolet ray (ultraviolet ray emitting device).

In this embodiment, the light emitting device is die-bonded onto the supporting body by heating the adhesive solution to a temperature in a range from 50° C. to 300° C. The heating may be carried out by placing the light emitting device on a heater or in an oven or the like. As the moisture and the solvent contained in small quantities in the solution that is in the state of gel are evaporated by heating, the adhesive solution in the state of gel is turned into an adhesive layer consisting of particles made mainly of $SiO_2$ having particle size of several nanometers. The adhesive layer consists of aggregate of numerous particles made mainly of the inorganic material having size of several nanometers, with voids existing between the particles. When the adhesive layer undergoes an significant change in temperature, the particles expand or contract. As a result, unlike a case where the light emitting device is bonded by means of molten glass or a resin having a thermal expansion coefficient significantly different from that of the supporting body without such particles as described above, the adhesive layer of the present invention as a whole is not subject to substantial thermal stress and is therefore free from peel-off or crack. Thus the light emitting apparatus of the present invention can maintain high reliability even when used in a situation subject to significant temperature changes.

Furthermore, since the adhesive layer of this embodiment is controlled so as to have a high viscosity, it does not flow away from -its place between the bottom surface of the light emitting device and the supporting body surface and on the side faces of the light emitting device, and is solidified in the place after die bonding and heating. Thus such a light emitting apparatus can be obtained as the light emitting device is die-bonded onto the surface of the supporting body by $SiO_2$ and does not dislocate from the position where it is initially placed.

[Filler]

The adhesive layer described above may also contain a filler having a heat conductivity higher than that of oxide containing at least one element selected from the group consisting of Si, Al, Ga, Ti, Ge, P, B, Zr, Y, Sn, Pb and alkali earth metals, or hydroxide containing at least one element selected from the group consisting of Si, Al, Ga, Ti, Ge, P, B, Zr, Y, Sn, Pb and alkali earth metals. Addition of such a filler improves the heat dissipating effect of the light emitting apparatus. The filler may be metal power such as alumina or Ag used for forming the adhesive layer from $SiO_2$ and die-bonding of the LED chip.

[LED Chip 101]

The LED chip 101 used as the light emitting device in this embodiment is one that can excite the fluorescent substance. The LED chip 101 used as the light emitting device is made by forming a light emitting layer of semiconductor such as GaAs, InP, GaAlAs, InGaAlP, InN, AlN, GaN, InGaN, AlGaN or InGaAlN on a substrate by MOCVD process or the like. The semiconductor layer may have homojunction structure, heterojunction structure or double heterojunction structure having MIS junction, PIN junction or PN junction. Emission wavelength can be controlled by adjusting the material and the mixed crystal composition of the semiconductor layer. The semiconductor active layer may also be formed in a thin film wherein quantum effect takes place, having single quantum well structure or multiple quantum well structure. The semiconductor layer is preferably be formed from nitride-based compound semiconductor (general formula $In_iGa_jAl_kN$, $0 \leq i$, $0 \leq j$, $0 \leq k$, $i+j+k=1$) capable of efficiently emitting light of relatively short wavelength that can efficiently excite the fluorescent substance.

When gallium nitride-based compound semiconductor is used, the semiconductor substrate is preferably made of such material as sapphire, spinel, SiC, Si, ZnO, GaAs or GaN. In order to form gallium nitride of good crystallinity, sapphire substrate is preferably used. In case a semiconductor film is formed on the sapphire substrate, it is preferable to form a buffer layer made of GaN, AlN or the like, and then form the gallium nitride semiconductor having pn junction thereon. Single crystal of GaN that is grown on the sapphire substrate by using $SiO_2$ as a mask may also be used as the substrate. In this case, the light emitting device and the sapphire substrate may be separated by removing $SiO_2$ by etching after forming the semiconductor layers. The gallium nitride-based compound semiconductor shows n-type conductivity when not doped with an impurity. In order to form a desired n-type gallium nitride semiconductor for such a purpose as improving the efficiency of light emission, it is preferable to introduce an n-type dopant such as Si, Ge, Se, Te or C. In order to form a p-type gallium nitride semiconductor, it is preferable to introduce a p-type dopant such as Zn, Mg, Be, Ca, Sr or Ba.

Since a nitride gallium-based compound semiconductor does not easily turn into p-type simply by doping with a p-type dopant, it is desired to apply annealing by heating in a furnace, irradiation with low-velocity electron beam or irradiating with plasma after introducing the p-type dopant. Specific layer constitution of the light emitting device may preferably be such as an n-type contact layer of gallium nitride semiconductor, an n-type cladding layer of aluminum gallium nitride semiconductor, an active layer of indium gallium nitride semiconductor doped with Zn and Si, a p-type cladding layer of aluminum gallium nitride semiconductor and a p-type contact layer of gallium nitride semiconductor are formed on a substrate made of sapphire or silicon carbide having a buffer layer formed from gallium nitride, aluminum nitride or the like at a low temperature. In order to form the LED chip 101 having a sapphire substrate, the p-type semiconductor and the n-type semiconductor surfaces are exposed by etching or the like, and electrodes of desired shape are formed on the semiconductors by sputtering, vacuum vapor deposition or the like. In the case of SiC substrate, a pair of electrodes may be formed by utilizing the electric conductivity of the substrate.

Then the semiconductor wafer is divided by means of a dicing saw having a rotating diamond-tipped blade for full cutting, or cutting in so as to form a groove wider than the blade tip width for half cutting and cleaving the wafer by an external force. Alternatively, the semiconductor wafer may also be divided by drawing extremely fine scribe lines in checkered pattern on the semiconductor wafer with a scriber having a diamond tip that makes reciprocal straight movement, then cleaving the wafer into individual chips by an external force. Thus the LED chips 101 made of the nitride-based compound semiconductor can be formed.

The light emitting apparatus of the present invention is operated to have the LED chip 101 emit light with peak emission wavelength in a range from 350 nm to 530 nm, in consideration of complementary color relationship with the fluorescent substance.

[Metal Package 105]

The metal package 105 used in the light emitting apparatus according to one embodiment of the present invention comprises a recess "a" that accommodates the light emitting device and a base b whereon lead electrodes are disposed, and serves as the supporting body for the light emitting device. Bottom surface of the recess and the bottom surface of the lead electrode are located in substantially the same plane.

To ensure heat dissipation and reduced size of the light emitting apparatus, it is desirable to make the package thinner. In order to mitigate the effect of the difference in thermal expansion coefficient from the insulating member provided in the interface with the lead electrode, contact area should be made larger. Accordingly, the inventors of the present invention divided the metal package into a portion where the light emitting device is mounted and a portion where the lead electrodes are fastened, and set the shape and thickness for each portion, thereby to improve the reliability.

Now each constituent member will be described in detail below.

(Recess "a")

The light emitting apparatus of this embodiment has the recess "a" in part of the package for disposing the light emitting device 101, the coating layers 108, 109 and the adhesive layer 110 therein. Bottom surface of the recess is located in substantially the same plane as that of the mounting surface for the light emitting device, namely the bottom surface of the lead electrode, so as to contact the component mounting substrate. Bottom skin of the recess is made thin in order to ensure sufficient heat dissipation performance, preferably from 0.05 mm to 0.2 mm, more preferably from 0.05 mm to 0.1 mm. The bottom skin of the recess thus made can dissipate heat generated by the light emitting device that is mounted in the recess efficiently to the mounting substrate. Thus the light emitting apparatus of the present invention achieves low thermal resistance and can dissipate heat generated by the light emitting device through a short heat conduction path to the mounting substrate.

The recess is preferably located at the center of the light emitting apparatus which enables it to achieve good directivity.

It is also preferable that the recess has enough capacity to accommodate the entire light emitting device. This makes it possible to cover the entire light emitting device mounted in the recess with a cover conversion layer. Since the metal package used in the present invention has high heat dissipation performance particularly in the recess where the light emitting device is mounted, good optical characteristic can be achieved. In addition, forming the inner wall of the recess in a tapered configuration makes it possible to make a light emitting apparatus that is capable of emitting light with even higher luminance.

Back surface of the recess, namely the outer wall surface, has convex shape with a groove between the bottom of the recess and the bottom surface of the lead electrode, allowing for satisfactory mounting. Without the groove, there is a possibility of solder applied to the bottom surface of the lead to stick to the adjacent base section or other component, resulting in short circuiting between the electrodes.

The recess can be formed by, for example, drawing of a metal sheet. In this embodiment, the recess is formed by drawing a metal sheet from the principal surface thereof so as to flow to the back of the metal. By forming a portion of the bottom of the recess from the flowing metal, mounting area can be increased and the bottom skin on the side of the recess can be made thicker. This is desirable because heat dissipation is improved and mechanical strength of the package is increased. Also because the bottom of the recess becomes part of the support for the light emitting device, accuracy of mounting is improved resulting in the achievement of desirable directivity.

(Base Section "b")

In this specification, flat portion of the metal package is referred as the base section "b". The base section has at least one through hole that penetrates therethrough in the direction of thickness. The through hole is provided for securing the lead electrode, and the light emitting apparatus of this embodiment has two through holes. The through holes oppose each other across the recess "a", while positive and negative lead electrodes are inserted through the respective through holes via an insulating member. Such a construction enables it to dispose the light emitting device at the middle between the lead electrodes, thus achieving good directivity.

Only requirement for the positive and negative lead electrodes of the light emitting apparatus of the present invention is that at least one of them is inserted in the through hole made in the base section via an insulator, and the other lead electrode may be formed integrally with the metal package as shown in FIG. 2. Such a constitution is preferable because there is no insulator between the light emitting device mounting surface of the package to one end face of the package, and therefore heat dissipation is improved.

The light emitting apparatus of the present invention is characterized in that the base section of the metal package is thicker than the bottom skin of the recess. Thickness of the base section is preferably in a range from 0.3 mm to 1.0 mm, and more preferably from 0.5 mm to 1.0 mm. When the base section is thinner than 0.3 mm, strength of the metal package as a whole becomes insufficient, and stress caused by welding with the lid may cause crack in the welding interface, which decreases the airtight performance and allows moisture to enter the package resulting in corrosion of wires and the light emitting device, thus lowering the reliability. When the base section is thicker than 1.0 mm, it becomes difficult for pulse current to reach the welding interface which may result in insufficient sealing. It also leads to larger thickness of the light emitting apparatus and higher cost.

Outer edge of the base section preferably has a flange section along the bottom of the base section. Such a structure causes the exposed end face of the package and the inner wall of the lid disposed on the light emitting surface side to be aligned with each other while the top surface of the flange section and the top surface of the lid are aligned, so that positioning of these components can be done easily and productivity is improved.

A supporting body may be provided on the back of the base section. It is preferable to dispose the support bodies at equal intervals between the lead electrodes that protrude from the back surface, since it improves the stability of mounting of the light emitting device. The support bodies are preferably made of a material similar to that of the base section, which helps improve the heat dissipation from the light emitting apparatus.

Heat conductivity of the lead electrodes and the metal package is preferably in a range from 10 W/m·K to 100 W/m·K, more preferably from 15 W/m·K to 80 W/m·K, and most preferably from 15 W/m·K to 50 W/m·K, which enables it to make the light emitting apparatus that is capable of operating with the input of a large current for a long period of time while maintaining reliability.

Thermal expansion coefficient of the lead electrodes and the metal package is preferably in a range from $0.05 \times 10^{-4}$/deg to $0.20 \times 10^{-4}$/deg.

Thermal expansion coefficient of the metal package is preferably the same as or higher than that of the insulator. When both members have the same thermal expansion coefficient, the two members can be bonded together without breaking. When thermal expansion coefficient of the metal package is higher than that of the insulator with difference within $0.01 \times 10^{-4}$/deg, breakage due to the difference in thermal expansion coefficient can be avoided by increasing the contact area, while the metal package shrinks to an appropriate degree due to the difference in thermal expansion coefficient so that the through hole shrinks in the radial direction, thus enabling the metal package and the insulating member to come into close contact with each other without need to provide an oxide film on the inner surface of the through hole. As a result, the manufacturing process can be simplified and the light emitting apparatus that can be manufactured favorably in mass production can be provided.

The material of the metal package preferably has high strength so as to form the package of smaller thickness. Preferred material for the metal package is, for example, kovar or iron. Kovar is an alloy of Fe—Ni—Co, that has thermal expansion coefficient similar to that of low-melting point glass used for the insulating member and provides good airtight sealing. This material is preferably coated with Ag plating, which improves reflection of light on the package surface while the Ag layer serves as a brazing material so as to improve bonding between the light emitting device, wire and the lid with the metal package. These effects an be further enhanced by providing lusterless plating of the Ag layer.

The metal package of the present invention is constituted as described above, so that the light emitting apparatus having high reliability can be manufactured with lower cost.

[Lead Electrode 102]

The light emitting apparatus according to one embodiment of the present invention has positive and negative lead electrodes 102 that are inserted via insulating member in the through holes made in the base section of the metal package. Distal end of the lead electrode protrudes from the surface of the base section, while the bottom surface of the lead electrode is located on substantially the same plane with the bottom surface of the mounting surface of the recess.

Top surface of the lead electrode 102 where a wire is to be connected has an area preferably in a range from 0.02 $mm^2$ to 0.2 $mm^2$, more preferably from 0.05 $mm^2$ to 0.15 $mm^2$. Such a constitution enables it to make the light emitting apparatus that allows for precise wire bonding and is small in size.

Bottom surface of the lead electrode where the light emitting device is to be mounted has an area preferably larger than the top surface, so that the lead electrode serves as the supporting body for the light emitting device thereby allowing stable surface mounting and improves heat dissipation due to enlarged contact area with the mounting substrate. The lead electrode of such a shape can be made, for example, by pressing the lead electrode formed in a cylindrical shape on the bottom side thereof. Preferable shape of the lead electrode on the bottom side is inverted T shape, fan shape, inverted taper shape or the like.

[Lid 106]

The light emitting apparatus according to one embodiment of the present invention has the lid 106 comprising a light transmitting window 107 and a metal section provided on the principal surface of the metal package 105. The window 107 is the light emitting surface of the light emitting apparatus and is preferably located at the center thereof.

In this embodiment, the window 107 is located in the top surface of the light emitting device 101 that is mounted in the recess "a" of the metal package 105, and has an intersect with the extension line of the inner wall of the recess "a". Light emitted from the edge of the light emitting device 101 is reflected on the side face of the recess "a" and is extracted in the front direction. Reflected light is considered to exist in a region roughly delimited by the extension lines of the side faces of the recess "a". Accordingly, the area of the window 107 that is the light emitting surface may be adjusted so as concentrate the reflected light efficiently in the window 107, thereby to obtain the light emitting apparatus that can emit light with high luminance.

Material to make the lid 106 preferably has a thermal expansion coefficient of a value similar to those of the package 105 and the light transmitting material of the window 107. The lid 106 has a Ni plating layer provided thereon as a protective film.

The lid 106 and glass can be hermetically sealed by placing a glass tablet in an opening that is formed in the lid 106 by using, for example, a sealing jig made of carbon and passing it through a furnace.

Shape of the lid 106 is not limited as long as it has a flat smooth surface that can make close contact with the welded surface of the package 105 and is capable of hermetically sealing the package 105. When a lid that is convex at the center is used, a color conversion member can be satisfactorily bound on the back surface of the window 107 of the lid 106, thereby making the light emitting apparatus with a high yield of production.

Moreover, when the window surface is curved into a lens shape, light can be favorably converged and the light emitting apparatus that emits light with high intensity in the front direction can be made.

Embodiment 2

Figure 3:
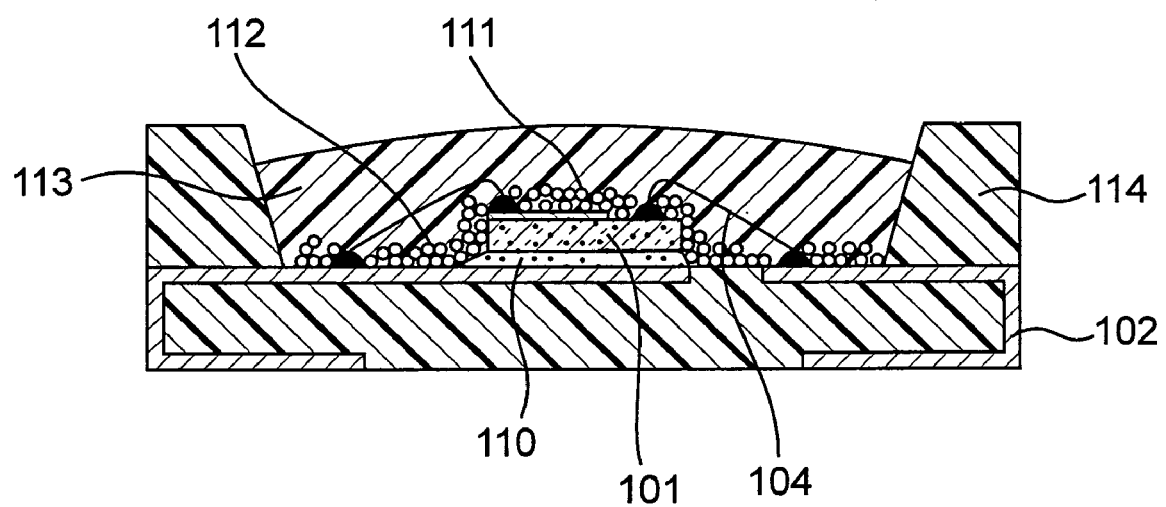
FIG. 3 is a schematic sectional view of a light emitting apparatus according to another embodiment of the present invention.

FIG. 3 is a schematic sectional view showing another embodiment of the light emitting apparatus of the present invention.

This embodiment is an application of the present invention to an LED mounted on a resin package, unlike the first embodiment. FIG. 3 shows the structure of an LED package 114 that serves as supporting body whereon the LED 101 is mounted. Reference numeral 104 denotes an electrically conductive wire, 113 denotes a molding member, 111 denotes a coating layer provided on the LED chip, 112 denotes a coating layer provided on the supporting body and 110 denotes an adhesive layer. In this embodiment, the coating layers 111 and 112 are single layers of an oxide that consists mainly of $SiO_2$ and contains fluorescent substance. The light emitting device 101 and the coating layers 111 and 112 are sealed with the molding resin 113, unlike in the first embodiment. The LED chip 101 is encased in the package 114, and is bonded onto one of external electrodes via silica 110 formed by the hydrolysis of ethyl silicate. A pair of positive and negative electrodes 102 of the LED chip are bonded with the external electrodes by means of the electrically conductive wires 104.

As shown in FIG. 3, the coating layers 111 and 112 of the present invention are formed also on the supporting body as well as on the top surface, side faces and corners of the LED chip 101. The coating layer 111 formed on the top surface, side faces and corners of the LED chip 101 and the coating layer 112 formed on the supporting body other than the LED chip have substantially the same thickness. The coating layers are formed continuously without interrupting at the corners of the LED chip 101.

The coating layers being formed as described above enables it to achieve uniform light emission characteristic due to substantially the same optical paths for light emitted from different points of the light emitting device. Also the coating layer being formed on the supporting body has such an effect that the coating layer is less likely to peel off the light emitting device and from the supporting body. Moreover, forming the coating layer that contains the fluorescent substance on the supporting body increases the probability of the light, that is randomly reflected in the molding member without wavelength conversion, to undergo wavelength conversion by the coating layer provided on the supporting body.

As shown in FIG. 3, since the coating layers 111 and 112 are formed as thin films, there is an interface between the coating layers 111 and 112 and the molding resin 113 near the bonding position of the electrically conductive wire 104. This configuration suppresses the occurrence of breakage of the electrically conductive wire 104 due to thermal stress caused by the difference in thermal expansion coefficient between the coating layers 111 and 112 and the molding resin 113.

Now the component members will be described in detail below.

[Package 114]

As shown in FIG. 3, the package 114 used in another embodiment of the present invention serves as the supporting body that holds and protect the LED chip 101 in the recess, and also has an external electrode 102 for electrical connection with the outside. The package 114 may also have a plurality of openings that re formed in accordance to the number and size of the LED chips 101. The package 114 is preferably made to have a dark color such as black or gray on the surface so as to shield light, or has a dark color on the outside of the light emitting surface of the package 114. The package 114 may also have, in addition to the coating layers 111, 112, the molding resin 113 that is a light transmitting protective member that protects the LED chip 101 from the environmental influence. The package 114 is made of a material that bonds well with the coating layers 111, 112 and the molding resin 113, and has high rigidity. The LED chip 101 is preferably electrically insulated from the outside. In addition, the package 114 is preferably made of a material of low thermal expansion coefficient in order to ensure bonding with the molding member 113 when subjected to thermal influence from the LED chip 101.

Bonding with the molding member 113 may be improved by applying embossing to the inner surface of the recess of the package 114 so as to increase the contact area, or by applying plasma treatment. The recess of the package 114 preferably expands toward the mouth with the side faces thereof being tapered. Such a configuration has an effect of improving the efficiency of extracting light since light emitted by the light emitting device is reflected on the side faces of the recess and is directed in the front direction. The package 114 may also be formed either integrally with the external electrode 102, or separately in a plurality of parts that are assembled by snap fitting. The package 114 as such can be relatively easily formed by insert molding or the like. The package may be made of a resin such as polycarbonate resin, polyphenylene sulfide (PPS), liquid crystal polymer (LCP), ABS resin, epoxy resin, phenol resin, acrylic resin or PBT resin, ceramics or a metal. When the light emitting apparatus employing an LED chip that emits light including ultraviolet ray is operated with a high output power, such problems are expected as the decreasing efficiency of light emission due to yellowing discoloration of the resin and reduced lifetime of the light emitting apparatus due to decreased mechanical strength, as the resin is deteriorated by ultraviolet ray. Therefore, use of a metal to form the package is preferable because it does not deteriorate unlike resin even when LED chip that emits light including ultraviolet ray is operated with a high output power.

Coloring agent used to give a dark color to the package 114 may be a dye or pigment and, for example, $Cr_2O_3$, $MnO_2$, $Fe_2O_3$ or carbon black may be preferably used.

The LED chip 101 and the package 114 may be bonded together with a thermosetting resin or the like. Specifically, epoxy resin, acrylic resin or imide resin may be used. When the light emitting apparatus employing an LED chip that emits light including ultraviolet ray is operated with a high output power, the bonding between the LED chip 101 and the package 114 is affected by ultraviolet ray and other radiation emitted by the LED chip, and light emitted by the LED chip is reflected by the resin and fluorescent substance contained therein, thereby filling the inside of the package with high density. This may result in such problems as the decreasing efficiency of light emission due to yellowing discoloration of the resin and reduced lifetime of the light emitting apparatus due to decreased mechanical strength, as the resin in the bond is deteriorated by ultraviolet ray. In order to prevent such deterioration of the resin in the bond due to ultraviolet ray, a resin including an ultraviolet absorbing agent, more preferably an inorganic material according to the present invention is used. Particularly when the package is made of a metallic material, the inorganic material according to the present invention or eutectic solder such as Au—Sn is used for bonding LED chip 101 and the package 114. As a consequence, the bonding portion is not deteriorated unlike in the case of using resin for bonding, even when the light emitting apparatus employing an LED chip that emits light including ultraviolet ray is operated with a high output power.

Ag paste, carbon paste, ITO paste, metal bump or the like is preferably used for fastening the LED chip 101 and electrically connecting the external electrodes 102 provided in the package 114.

[External Electrode 102]

The external electrodes 102 shown in FIG. 3 are provided for supplying power from the outside of the package 114 to the LED chip 101 disposed therein. Accordingly the electrodes may be provided in various forms such as an electrical conductive pattern or lead frame formed on the package 114. The external electrodes 102 may also be formed in various sizes in consideration of the heat dissipation, electrical conductivity and characteristics of the LED chip 101. The external electrodes 102 preferably have a high heat conductivity for dissipating the heat generated by the LED chip 101 to the outside. Electrical resistance of the external electrode 102 is preferably $300\mu \Omega \cdot cm$ or less, and more preferably $3\mu \Omega \cdot cm$ or less. Heat conductivity is preferably 0.01 cal/(s)(cm²)(° C./cm) or higher, and more preferably 0.5 cal/(s)(cm²)(° C./cm) or higher The external electrodes 102 may be made of copper or phosphor bronze sheet coated with metal plating of silver, palladium, gold or the like or solder applied thereon. In case the external electrodes 102 are formed in the form of lead frame, thickness of the electrodes is preferably in a range from 0.1 mm to 2 mm for the convenience of processing, while a variety is allowed for depending on the electrical conductivity and heat conductivity. In case the external electrodes 102 are formed on a supporting body made of glass epoxy resin or ceramics, the electrode may be formed from copper foil or tungsten film. When a metal foil is formed on a printed circuit board, thickness of the foil such as copper foil is preferably from 18 to 70 μm. The copper foil may also be covered by gold or solder plating applied thereon.

[Electrically Conductive Wire 104]

The electrically conductive wire 104 is required to be good in ohmic contact and mechanical connection with the electrode of the LED chip 101 and high in electrical conductivity and heat conductivity. Heat conductivity is preferably 0.01 cal/(s)(cm²)(° C./cm) or higher, and more preferably 0.5 cal/(s)(cm²)(° C./cm) or higher. Diameter of the electrically conductive wire 104 is preferably in a range from 10 to 70 μm when the light emitting apparatus is operated with high output, or in consideration of the convenience of processing. The electrically conductive wire 104 may be made of a metal such as gold, copper, platinum or aluminum, or an alloy thereof. The electrically conductive wire 104 made of such a material can be used to easily connect between the electrodes of the LED chip 101 and inner leads and mount leads by means of a wire bonding tool or the like.

[Molding Member 113]

The molding member 113 may be provided to protect the LED chip 101, the electrically conductive wires 104, and the coating layers 111, 112 that contain the fluorescent substance from the outside, or for the purpose of improving the efficiency of extracting light according to the application of the light emitting apparatus. The molding member 113 may be formed preferably from various resin or glass. For the material to make the molding member 113, a transparent resin having high weatherability such as epoxy resin, urea resin, silicone resin or fluorocarbon resin, or glass. A diffusion agent may also be contained in the molding member in order to mitigate the directivity of light emitted by the LED chip 101 and increase the viewing angle. The molding member 113 may be made of a material that is the same as that of the binder of the coating layer or different therefrom.

In case a metal package is used to hermetically seal the LED chip 101 together with nitrogen gas, the molding member 113 is not an indispensable member in the present invention. A resin that is durable against ultraviolet ray such as fluorocarbon resin may be used as the molding member also in case the light emitting apparatus uses an LED chip that emits ultraviolet ray.

Embodiment 3

This embodiment is a method of spraying the coating solution in the form of spiral stream of mist that contains the fluorescent substance from above the light emitting device that is placed on the supporting body and is being heated. This method can be applied not only to the coating material of the present invention that is made of an inorganic material, but also to a coating material of the prior art that is made of an organic material.

Figure 4:
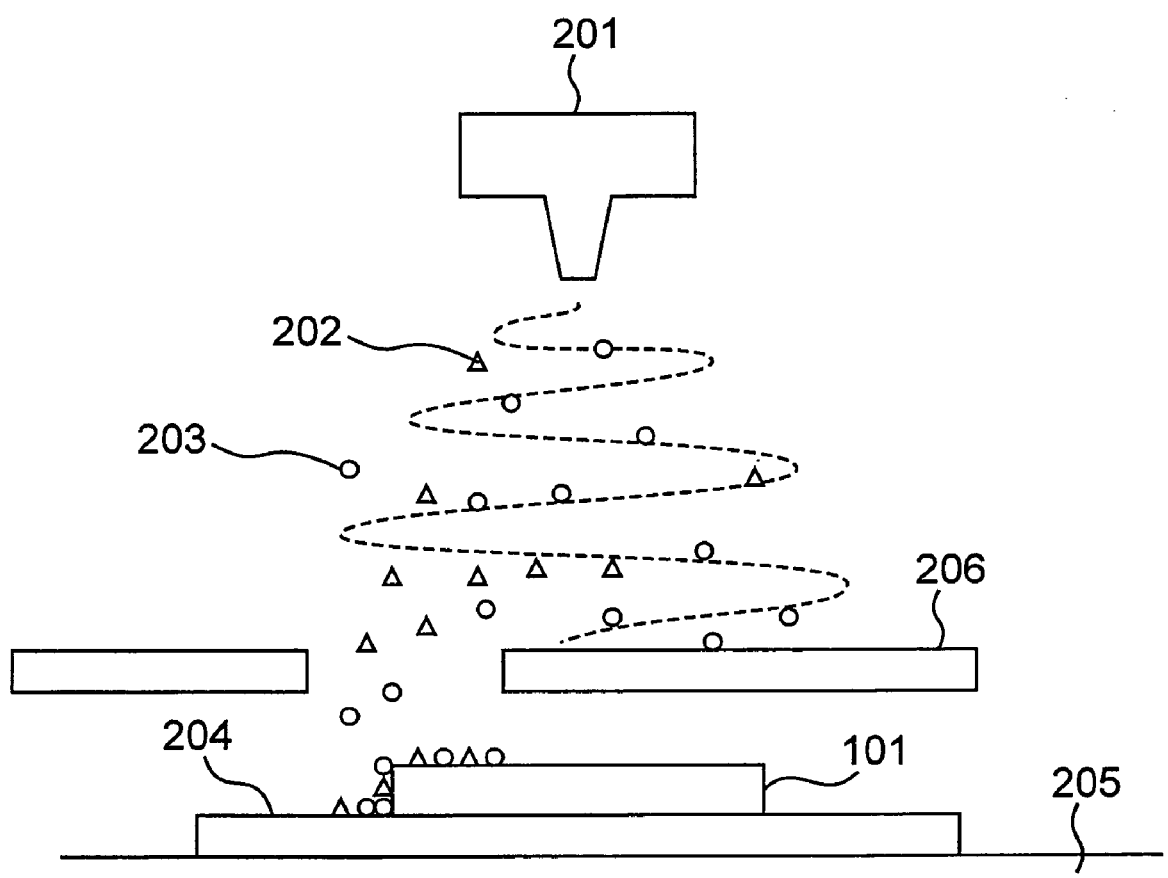
FIG. 4 is a diagram schematically showing a process of spraying a coating solution in the form of spiral mist stream to the light emitting device.

FIG. 4 is a schematic diagram showing the process of spraying the coating solution to the light emitting device that is fastened onto the supporting body. This embodiment uses an apparatus that discharges the coating solution 203 and a gas (air in this embodiment) in a spiral stream from a nozzle 201. The apparatus has several gas vents disposed around the nozzle 201, while the gas discharged from these vents is directed toward the surface to be coated with a certain angle. As a result, as the gas is supplied through the vents that rotate around the coating solution nozzle, the gas stream formed by all the gas jets from the vents combined becomes something like a spiral stream or inverted tornado. The nozzle 201 of this apparatus has the vent for the coating solution located at the center thereof, from which the coating solution is spouted simultaneously as the gas is discharged so that the coating solution 203 in the form of mist is carried by the gas while diffusing in the stream of spiral or inverted tornado shape.

Diameter of the spray stream spreading in a spiral shape increases from the position of the nozzle toward the surface of the light emitting device 101 as shown in FIG. 4. Rotation speed of the spray of the coating solution 203 decreases from the position of the nozzle toward the surface of the light emitting device 101. That is, while the coating solution 203 spreads in a conical shape in the vicinity of the nozzle as the spray of the coating solution 203 is discharged from the nozzle and diffuses in the air, the spray expands in a cylindrical shape at a position away from the nozzle. In this embodiment, for this reason, it is desirable to adjust the distance between the bottom end of the nozzle 201 and the top surface of the light emitting device 101, so that the surface of the light emitting device 101 is located at a position where the spray expands in a cylindrical shape. At this position, since the spray is rotating in a spiral manner with a decreased speed, the coating solution spray covers not only the entire top surface of the light emitting device but also the side faces thereof, while reaching portions of the top surface that is hidden by the electrically conductive wire. Therefore, application of the coating solution can be carried out with the light emitting device 101 or the nozzle 201 being fixed. Also because velocity of the spray has decreased at the position where the spray expands in a cylindrical shape, the surface of the light emitting device 101 does not receive impact from the fluorescent substance particles 202 contained in the solution when the surface of the light emitting device 101 is exposed to the spray. In addition, no deformation or breakage of the electrically conductive wire occurs thus resulting in improved yield of production.

As a result, convenience of operation is improved and the entire surface of the light emitting device, namely the side faces and corners as well as the top surface of the light emitting device can be covered with the coating layer that contains fluorescent substance bound with $SiO_2$ and is formed with uniform thickness.

Meanwhile in this embodiment, the coating solution 203 can be sprayed onto the light emitting device 101 from above after die bonding the light emitting device 101 onto the package 204 and wire bonding the electrodes of the light emitting device 101 with the external electrodes, while a plurality of packages 204 are disposed. However, in case the side faces of the recess of the package 204 are tapered and are used as reflecting surfaces for improving the efficiency of extracting light in the normal direction of the package, the coating solution deposited on the side faces of the recess causes random reflection of light emitted by the light emitting device, thus making it impossible to improve the efficiency of extracting light in the normal direction of the package 204.

According to this embodiment, in order to prevent the coating solution from being deposited on the side faces of the recess of the package 204 and on the external electrodes, the coating solution is sprayed onto the surface of the light emitting device 101 from above a mask 206, as shown in FIG. 4. The mask 206 is a sheet that completely covers the side faces of the recess of the package 204 and the external electrode (not shown) and has openings of such a size that allows the coating solution to deposit on the top surface, side faces and corners of the light emitting device 101. The mask may be made of a metal or a reinforced plastic.

The light emitting device 101 that has been applied with the coating solution according to this embodiment is heated on a heater 205 to a temperature in a range from 50 to 300° C., as shown in FIG. 4. The light emitting device 101 may also be heated by putting the light emitting device 101 in an oven or the like. As ethanol and other small amount of water and the solvent contained in the hydrolysate solution in the form of sol are evaporated by heating, mainly amorphous $SiO_2$ is obtained from the coating solution sol. Since the coating solution 203 of this embodiment has a controlled level of viscosity, the solution does not flow out of the top surface, side faces and corners of the light emitting device 101 and the surface of the supporting body where it has been sprayed, and is heated at the place immediately after being sprayed. As a result, the top surface, the side faces and corners of the light emitting device can be covered with the coating layer wherein the fluorescent substance is bound with $SiO_2$.

Figure 5:
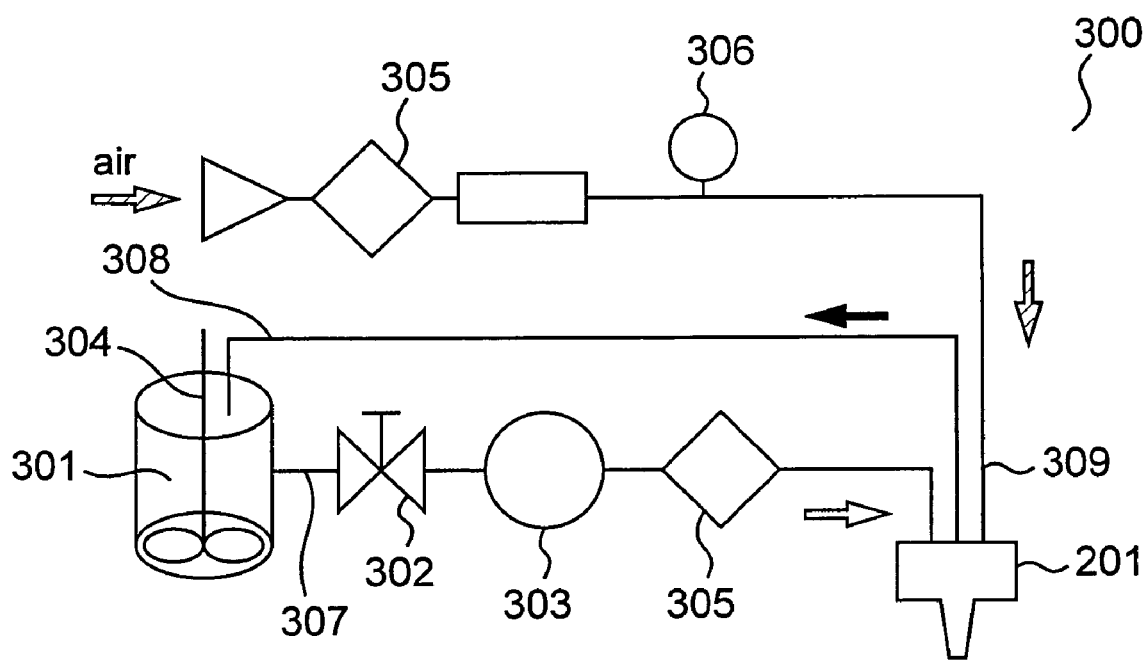
FIG. 5 is a schematic diagram showing the constitution of an apparatus for spraying the coating solution.

FIG. 5 is a schematic diagram showing the structure of a spray apparatus 300 used in the present invention.

As shown in FIG. 5, such a spray apparatus 300 is used that comprises a container 301 that holds the coating solution, a valve 302 for regulating the flow rate of the coating solution, a circulation pump 303 that sends the coating solution to the nozzle 201 and then from the nozzle 201 to the container 301, and the nozzle 201 for discharging the coating solution in spiral stream, which are connected with each other through transport tubes 307, 308 and 309.

(Container 301)

The container 301 that contains the coating solution is equipped with a mixer 304 that constantly stirs the coating solution during the coating operation. The coating solution accommodated in the container 301 is constantly stirred by the mixer 304, so that the fluorescent substance contained in the coating solution is always uniformly distributed in the coating solution.

(Valve 302)

The valve 302 opens and closes so as to regulate the flow rate of the coating solution that is sent from the container 301 through the transport tube 309.

(Circulation Pump 303)

The circulation pump 303 sends the coating solution from the container 301 via the valve 302 and the compressor 305 through the transport tube 309 to the distal end of the nozzle 201 and then sends the remaining coating solution that has not been discharged from the nozzle 201 through the transport tube 308 to the container 301. Since the coating solution is sent by the circulation pump 303 from the container 301 via the valve 302 through the transport tube 309 to the distal end of the nozzle 201 and is then sent through the transport tube 308 to the container 301, the coating solution is always circulating in the spray apparatus. As a result, since the coating solution is always stirred or circulating in the spray apparatus, the fluorescent substance contained in the coating solution is always uniformly distributed in the coating solution during the coating operation.

(Compressor 305)

The compressor 305 is installed in the apparatus via the transport tube 307 or 309, and compresses air that is transported through the transport tube 307 and regulates the pressure of the coating solution being sent through the transport tube 309. Air that is compressed and the coating solution of which pressure is controlled by the compressor 305 are sent to the nozzle 201, where pressure of the compressed air is monitored with a pressure gage 306.

A control lever is installed before the nozzle, so that quantity of the coating solution to be discharged from the nozzle can be controlled by the force applied to the lever.

With the spray apparatus 300 described above, the coating solution is discharged in jet of a high speed together with high pressure gas and applied to the top surface, side faces and corners of the light emitting device.

Examples of the present invention will be described below. It will be understood that the present invention is not limited to these specific examples.

EXAMPLE 1

In this example, a light emitting apparatus as shown in FIG. 1 and FIG. 2 is fabricated.

Fabrication of LED Chip

The LED chip was formed by the MOCVD process, wherein TMG (trimethyl gallium) gas, TMI (trimethyl indium) gas, nitrogen gas and dopant gas were supplied together with the carrier gas to flow over a cleaned sapphire substrate, thereby to form gallium nitride-based compound semiconductor. Gallium nitride-based semiconductor having n-type conductivity and gallium nitride-based semiconductor having p-type conductivity were formed by supplying $SiH_4$ and $Cp_2Mg$, respectively, as the dopant gas, thereby forming a pn junction. The semiconductor light emitting device was made by forming a contact layer from gallium nitride semiconductor having n-type conductivity, a cladding layer of gallium aluminum nitride semiconductor having p-type conductivity, a contact layer of gallium nitride semiconductor having p-type conductivity and an active layer of undoped InGaN having single quantum well structure about 3 nm thick between the contact layer of n-type conductivity and the cladding layer of p-type conductivity. (The sapphire substrate has a buffer layer formed thereon from gallium nitride semiconductor at a low temperature. The semiconductor having p-type conductivity is annealed at a temperature of 400° C. or higher after the film has been formed.)

After having the surface of the p-type and n-type semiconductors formed on the sapphire substrate exposed by etching, electrodes were formed by sputtering. The semiconductor wafer was scribed and cleaved by applying an external force to make LED chips measuring 350 µm square.

(2) Fabrication of Package

The package 105 is made of a metal and has a recess "a" at the center. A base section "b" that surrounds the recess "a" has two through holes penetrating in the direction of thickness thereof, with the through holes opposing each other across the recess "a". The positive and negative lead electrodes 102 are inserted through the respective through holes via a hard glass 103 that serves as insulating member.

(3) Die Bonding

The LED chip 101 that is mounted in the recess "a" is a light emitting device that emits ultraviolet ray. While the LED chip 101 and the metal package 105 may be bonded by using a eutectic solder such as Au—Sn, they are die-bonded using an inorganic material that is oxide containing at least one element selected from the group consisting of Si, Al, Ga, Ti, Ge, P, B, Zr, Y and alkali earth metals in this example.

The light emitting apparatus having the LED chip die bonded with $SiO_2$ is made by preparing silica sol from a mixture of an alkyl silicate and an organic solvent having high boiling point in a predetermined proportion as the adhesive solution, dispensing the adhesive solution at a predetermined position of the package, placing the LED chip with the bottom surface thereof facing down on the adhesive solution, and heating the chip while pressing.

Now the method of die-bonding the LED chip by means of $SiO_2$ according to the present invention will be described below taking an example in a case of using a hydrolysate solution of ethyl silicate as the adhesive solution. Since the concentration of hydrochloric acid added to the hydrolysate solution of ethyl silicate as a catalyst is as low as 20 to 500 ppm so as to make the solution substantially neutral, surface of the metal package will not be affected by acid or alkali when exposed to the solution.

Step 1

While the alkyl silicate used according to the present invention may be methyl silicate, ethyl silicate, N-propyl silicate or N-butyl silicate, this example uses a colorless and transparent oligomer liquid made by condensation of ethyl silicate containing 30 to 50% by weight of $SiO_2$. The concentration of silica from 30 to 50% is an empirically justified value in consideration of bonding strength, viscosity, specific gravity, stability in storage and workability. This constitution enables it to maintain such a level of bonding strength that the light emitting device does not come off the supporting body during the wire bonding operation. When the bonding strength is weak, retracting a capillary after supplying the bonding material may cause the light emitting device to be pulled by the capillary, thus resulting in a trouble of the light emitting device coming off the supporting body. Ethyl silicate is used in the form of sol that is made through the hydrolysis reaction with water in the presence of a catalyst (HCl). In this example, ethyl silicate containing 30 to 50% by weight of $SiO_2$, a solvent, water and 1N hydrochloric acid (HCl) that are mixed in weight proportions of 75:16:8:1, so that ethyl silicate undergoes the hydrolysis reaction, and adjusted to make a sol having viscosity of the mixture solution about 120 cps at 25° C.

First, the hydrolysate solution of ethyl silicate and ethylene glycol were mixed in weight proportion of 1:1 and stirred to make the adhesive solution. Since the ethyl silicate sol can easily dry spontaneously to turn into a gel, it is preferably mixed with an organic solvent having high boiling point (100 to 200° C.) such as ethylene glycol, butanol or butyl acetate. Since such an organic solvent having high boiling point is a liquid at the normal temperature, mixing ethyl silicate and the organic solvent enables it to prevent the supply of adhesive solution from fluctuating due to solidified material such as dried $SiO_2$ sticking onto the nozzle tip of the dispensing apparatus or the tip of the application needle of the stamping apparatus, thereby improving the workability.

Step 2

The adhesive solution prepared as described above is charged to a supplying apparatus and is applied to a predetermined position of the package by dispensing or stamping. In Example 1, quantity of the adhesive solution supplied to the center of the bottom surface of the recess "a" is controlled so that the adhesive solution covers the side faces of the substrate of the light emitting device when the light emitting device is placed on the adhesive solution and is pressed down.

Step 3

With the top surface of the supporting body and the bottom surface of the LED chip facing each other via the adhesive solution, die bonding is carried out while pressing the LED chip from above. When left to stand at the room temperature, the hydrolysate solution of ethyl silicate in the state of sol dries spontaneously to turn to gel.

Step 4

The light emitting device and the metal package are heated on a heater to a temperature in a range from 50 to 300° C., preferably from 150 to 200° C. for about two hours, in order to obtain amorphous $SiO_2$ from the adhesive solution that has been turned to gel through spontaneous drying and evaporate and remove ethanol that has been generated through the hydrolysis of ethyl silicate and the solvent. This operation enables it to form the light emitting apparatus having the light emitting device die-bonded by means of $SiO_2$ without the light emitting device being dislocated from the position where it has been placed via the adhesive solution. It is preferable to heat the adhesive solution gradually, without rapid temperature rise. It has been verified that less organic material remains in the adhesive solution when temperature of the adhesive solution in the state of gel is raised gradually, so that a light emitting apparatus of high reliability with less deterioration and discoloration of the adhesive layer can be made even when a light emitting device that emits light including wavelength shorter than that of blue light.

Since light emitting performance of the nitride-based light emitting device decreases when exposed to a temperature higher than 350° C., an alkyl silicate that is turned to amorphous at temperatures in a range from 150 to 200° C. is suitable as the adhesive solution used in die bonding of the light emitting device onto the supporting body such as package. $Si(OH)_2$ generated when heated to 200° C. in this process is decomposed into $SiO_2$ when dried at a temperature of 300° C. for two hours.

When the adhesive layer is formed from an inorganic material such as $SiO_2$ and the light emitting device is die-bonded onto the supporting body such as package as described above, the adhesive layer undergoes less deterioration and discoloration even when a light emitting device that emits light including wavelength shorter than that of blue light, compared to a light emitting apparatus made by die bonding with a resin of the prior art made of an organic material. Deterioration or discoloration is also less likely to occur when exposed to high output light and high temperature accompanying thereto.

(4) Wire Bonding

The electrodes provided on the LED chip 101 and the positive and negative lead electrodes 102 are wire-bonded by means of gold wires. At this time, the electrode surface of the LED chip 101 is heated to about 180° C.

(2) Fabrication of Fluorescent Substance-bound Coating Layer

A coating layer of double layer structure is formed as shown in FIG. 2 in this example. First, the coating layer 109 made by binding CCA-Blue (chemical formula $Ca_{10}(PO_4)_6ClBr$, activated with Mn, Eu) fluorescent substance by means of $Al_2O_3$ is formed on the light emitting device, and a coating layer 108 is formed thereon that is made by binding yttrium aluminum garnet fluorescent substance with $SiO_2$.

The CCA-Blue fluorescent substance was made as follows. An oxide of phosphate that constitutes the CCA-Blue fluorescent substance or a compound that produces the oxide through pyrolysis are weighed to predetermined quantities and mixed in a ball mill or the like. The material is then put into a crucible and fired in reducing atmosphere such as $N_2$ or $H_2$ at a temperature from 800 to 1200° C. for three to seven hours. The fired material is crushed in a wet process, sieved, dehydrated and dried so as to make the CCA-Blue fluorescent substance. To make yttrium aluminum garnet fluorescent substance, coprecipitation of a solution of rare earth elements such as Y, Gd and Ce in oxalic acid in stoichiometrical proportions was fired and mixed with aluminum oxide, thereby to obtain the mixed material. Ammonium fluoride was added as a flux to this mixed material, that was then put into a crucible and fired in air at 1400° C. for three hours, thereby to obtain fired material. Then the fired material was subjected to ball-mill process in water, washing, separation, drying and sieving, thereby to obtain the $(Y_{0.8}Gd_{0.2})_3Al_5O_{12}$:Ce fluorescent substance.

The coating layers 108 and 109 are formed as follows. The fluorescent substance (powder) is added to a mixture of a predetermined organometallic compound and an organic solvent having high boiling point in predetermined proportion in the state of sol, to prepare the coating solution containing the fluorescent substance uniformly dispersed therein. The coating solution is applied by spraying so as to cover the entire surface of the light emitting device that has been die-bonded in the package and wire-bonded, followed by heating to turn the material amorphous.

Now the method of forming the coating layer by spray coating will be described below taking an example in a case of using ethyl silicate to form the coating layer 108. Since the concentration of hydrochloric acid added to the hydrolysate solution of ethyl silicate as a catalyst is as low as 20 to 500 ppm so as to make the solution substantially neutral, surface of the metal package will not be affected by acid or alkali when the solution is applied to the surface of the light emitting device. Material of the metal package such as Ag or Ni will not also be corroded.

Step 1

While the alkyl silicate may be methyl silicate, ethyl silicate, N-propyl silicate or N-butyl silicate, this example uses a colorless and transparent oligomer liquid made by condensation of ethyl silicate containing 10% by weight of $SiO_2$. The concentration of 10% by weight of silica is an empirically justified value in consideration of such factors as viscosity, specific gravity, stability in storage and workability. Ethyl silicate is used in the form of sol that is made through the hydrolysis reaction with water in the presence of a catalyst (HCl). In this example, ethyl silicate that contains 10% by weight of $SiO_2$, a solvent, water and 1N hydrochloric acid (HCl) that are mixed in weight proportions of 75:16:8:1 is used, so that ethyl silicate undergoes the hydrolysis reaction, and adjusted to make a sol having viscosity of the mixture solution in a range from 2.5 to 500 cps at 25° C.

First, the hydrolysate solution of ethyl silicate, ethylene glycol and the fluorescent substance were mixed in weight proportion of 1:1:1 and stirred so that the fluorescent substance having a mean particle size of 3 to 10 μm was uniformly dispersed therein, thereby to make the coating solution. Since the ethyl silicate in the state of sol can easily dry spontaneously and turn into gel, it is preferably mixed with an organic solvent having high boiling point (100 to 200° C.) such as ethylene glycol, butanol or butyl acetate. Since such an organic solvent having high boiling point is a liquid at the normal temperature at which the spray apparatus of the present invention is expected to operate, mixing ethyl silicate and the organic solvent enables it to prevent the supply of coating solution from decreasing due to solidified material such as dried $SiO_2$ sticking onto the nozzle tip, thereby improving the workability. It was verified that the fluorescent substance was uniformly dispersed in the hydrolysate solution of ethyl silicate that was turned to gel.

Step 2

The coating solution prepared as described above is applied using the apparatus shown in FIG. 5. The coating solution is put into the container 301, from which the coating solution is sent by the circulation pump 303 to the nozzle 201. Flow rate of the coating solution is regulated by means of the valve 302.

While the coating solution spreads in a conical shape in the vicinity of the nozzle as the spray of the coating solution is discharged from the nozzle 201, the spray expands in a cylindrical shape at a position away from the nozzle. In this example, for this reason, the distance between the bottom end of the nozzle and the top surface of the light emitting device is adjusted to 40 to 50 mm, so that the surface of the light emitting device is located at a position where the spray expands in a cylindrical shape. At this time, the light emitting device is die-bonded onto the package with the same material as the coating solution, while the electrodes of the light emitting device and external electrodes are wire-bonded with gold wires or the like. In addition, a metal mask is disposed in front of the package, so that the top surface, side faces and corners of the light emitting device are seen through the opening made in the metal mask when viewed from above the metal mask, while the side faces of the package and the lead electrodes are completely covered by the metal mask. Consequently, the coating solution sprayed from above the metal mask is deposited on the top surface, side faces and corners of the light emitting device.

With this spray coating operation, the top surface, side faces and corners of the light emitting device are covered by coating layer wherein fluorescent substance is bound with $SiO_2$ containing the fluorescent substance uniformly distributed therein.

Step 3

When left to stand at the room temperature after step 2, the hydrolysate solution of ethyl silicate in the state of sol dries spontaneously so as to gradually turn to gel.

Step 4

The light emitting device is heated on the heater 205 to a temperature of 150° C. for 30 minutes, in order to obtain amorphous $SiO_2$ from the coating solution that has been turned to gel through spontaneous drying and evaporate and remove ethanol, that has been generated through the hydrolysis of ethyl silicate, and the solvent. This operation enables it to form coating layer wherein fluorescent substance is bound with $SiO_2$ on the top surface, side faces and corners of the light emitting device without the coating solution flowing out of the place where it has been applied on the top surface, side faces and corners of the light emitting device. It is preferable to heat the adhesive solution gradually, without rapid temperature rise. It has been verified that less organic material remains in the adhesive solution when temperature of the adhesive solution in the state of gel is raised gradually, so that a light emitting apparatus of high reliability can be made even when a light emitting device that emits light including wavelength shorter than that of blue light is used.

Since light emitting performance of the nitride-based light emitting device decreases when exposed to a temperature higher than 350° C., an alkyl silicate that can be bonded onto the surface of the light emitting device at temperatures in a range from 50 to 300° C. is suitable as the binder for the fluorescent substance. Most of $Si(OH)_2$ generated when heated to 200° C. in this process is decomposed into $SiO_2$ when dried at a temperature of 300° C. for two hours.

Through the process described above, the top surface, side faces and corners of the light emitting device are covered by the coating layer about 20 μm thick that contains the fluorescent substance uniformly distributed therein. In the coating layer, fluorescent particles having a mean particle size of 3 to 10 μm are fixed in the condition of being surrounded by amorphous particles having a mean particle size of several nanometers consisting mainly of inorganic materials such as $SiO_2$ and $Si(OH)_2$.

Analyses of the coating layer wherein the fluorescent substance is bound with $SiO_2$ and the adhesive layer showed that these layers contained hydrochloric acid (HCl) that was used as the catalyst in the process of the. hydrolysis of ethyl silicate, inorganic materials such as $Si(OH)_2$ generated in step 4 and organic materials such as ethyl silicate and ethanol that did not undergo the reaction, each in a concentration from several units to several tens of units of ppm. Therefore, the coating layer about 20 μm thick wherein the fluorescent substance is bound with $SiO_2$ may be assumed to consist of 99.9% or more of inorganic materials such as $SiO_2$ and the fluorescent substance.

(4) Sealing

The light transmitting window 107 and the lid 106 consisting of a metal part are placed on the principal surface of the metal package, and the metal portion and the metal package 105 are welded so as to hermetically seal the light emitting device and nitrogen gas in the package 105.

With this constitution, the adhesive layer and the coating layer do not experience deterioration and discoloration even when the light emitting device that emits light including wavelength shorter than that of blue light is used, and are free from deterioration and discoloration upon exposure to high output light and the accompanying heat thereby making it possible to make the light emitting apparatus of high reliability. Moreover, the coating layer wherein the fluorescent substance is bound with $SiO_2$ has refractive index of about 1.4 that is smaller than that of the coating layer wherein the fluorescent substance is bound with $Al_2O_3$ (about 1.7), and the refractive index of the coating layer wherein the fluorescent substance is bound with $Fe_2O_3$ is smaller than that of the gallium nitride-based compound semiconductor (about 2.5). As a result, efficiency of extracting light from the light emitting device is improved and the output power can be increased, while improving the heat dissipation performance.

In this embodiment, content of the fluorescent substance in the coating layer is preferably set to a relatively high value so that the light emitted therefrom consists of substantially only white light that has been produced through wavelength conversion by the fluorescent substance, that is, most of blue light emitted by the light emitting device is absorbed by the fluorescent substance thereby to excites the fluorescent substance. This enables it to improve the light emission efficiency (ratio of optical output power to the input power supplied to the light emitting device).

Content of the fluorescent substance in the coating layer that contains the fluorescent substance bound therein is set according to the desired color tone, and the present invention is not limited by a particular value of the content of the fluorescent substance. However, according to the present inventors' investigation, addition of even a small amount of fluorescent substance to the coating layer that contains the fluorescent substance bound by oxide therein increases the bonding strength of the layer with the surface of the light emitting device and makes the layer less prone to breakage.

In the light emitting apparatus of Example 1 constituted as described above, since the light emitting device is die-bonded with an inorganic material that hardly deteriorates when exposed to ultraviolet ray and the coating layer that contains the fluorescent substance bound by the inorganic material therein is formed to cover the entire surface of the light emitting device, a light emitting device that emits in the ultraviolet region may also be used as the LED chip.

Furthermore, the coating layer and the adhesive layer are formed in the recess "a" that is insulated from the lead electrodes and the light emitting device is mounted in the recess "a". As a result, since the light emitting device is supplied with the electric power necessary for emitting light from the wire and is not subjected to noise or other influence by the current flowing in the lead electrodes, light emitting apparatus of high reliability can be made. In case the light emitting device is fastened on the lead electrode, the wire that connects the other lead electrode whereon the light emitting device is not fastened and the electrode of the light emitting device may touch the lead electrode whereon the light emitting device is fastened, thus leading to a decrease in the yield of production. When the light emitting device is fastened onto the supporting body that is insulated from the positive and negative lead electrodes, as in the case of the present invention, the yield of production can be improved.

EXAMPLE 2

A light emitting apparatus was made similarly to Example 1, except for applying the coating solution to the surfaces of the light emitting device and the supporting body by dispensing, spin coating, screen printing or other method, instead of spraying the coating solution to the light emitting device as Example 1.

In the cross section of the light emitting apparatus made in Example 2, although a $SiO_2$ layer that contains the fluorescent substance is formed on the top surface of the light emitting device and on the surface of the supporting body, the $SiO_2$ layer containing the fluorescent substance is not formed on the corners of the light emitting device and therefore the fluorescent substance does not exist on the corners. However, since the light emitting apparatus having the fluorescent substance bound by the inorganic material that is not deteriorated by the exposure to ultraviolet ray can be constituted by using the light emitting device that emits ultraviolet ray, the light emitting apparatus that has less variation in the color of emitted light after long period of operation could be provided.

EXAMPLE 3

A light emitting apparatus was made similarly to the Example 1, except for forming a coating layer that contains zirconia ($ZrO_2$) as the main component and does not contain fluorescent substance on a light emitting device that emits blue light or light of wavelength shorter than that of blue light, and forming a coating layer that contains $SiO_2$ as the main component and does not contain fluorescent substance on the former coating layer. As described above, addition of even a small amount of fluorescent substance to the coating layer that contains the fluorescent substance bound therein increases the bonding strength of the layer with the surface of the light emitting device and makes the layer less prone to breakage. However, the coating layer of this example does not contain the fluorescent substance. Therefore, the coating solution having viscosity of about 130 cpc at 25° C. was used, in order to maintain the bonding strength of the coating layer with the surface of the light emitting device constant and prevent the coating layer from peeling off the surface of the light emitting device.

With this constitution, the adhesive layer and the coating layer do not experience deterioration and discoloration even when a light emitting device that emits light including wavelength shorter than that of blue light is used, and are free from deterioration and discoloration upon exposure to high output light and the accompanying heat thereby making it possible to make the light emitting apparatus of high reliability. Moreover, the coating layer wherein the fluorescent substance is bound with $SiO_2$ has refractive index of about 1.4 that is smaller than that of the coating layer wherein the fluorescent substance is bound with $ZrO_2$ (about 2.0), and the refractive index of the coating layer wherein the fluorescent substance is bound with $ZrO_2$ is smaller than that of the gallium nitride-based compound semiconductor layer (about 2.5). As a result, such effects can be achieved as efficiency of extracting light from the light emitting device is improved and the output power can be increased.

EXAMPLE 4

A light emitting apparatus was made similarly to Example 4, except for forming a coating layer that contains yttria ($Y_2O_3$) as the main component and does not contain fluorescent substance on the a light emitting device that emits blue light or light of wavelength shorter than that of blue light, and forming a coating layer that contains $SiO_2$ as the main component and does not contain fluorescent substance on the former coating layer.

With this constitution, the adhesive layer and the coating layer do not experience deterioration and discoloration even when a light emitting device that emits light including wavelength shorter than that of blue light is used, and are free from deterioration and discoloration upon exposure to high output light and the accompanying heat thereby making it possible to make the light emitting apparatus of high reliability. Moreover, the coating layer wherein the fluorescent substance is bound with $SiO_2$ has refractive index of about 1.4 that is smaller than that of the coating layer wherein the fluorescent substance is bound with $Y_2O_3$ (about 1.78), and the refractive index of the coating layer wherein the fluorescent substance is bound with $Y_2O_3$ is smaller than that of the gallium nitride-based compound semiconductor layer (about 2.5). As a result, such effects can be achieved as efficiency of extracting light from the light emitting device is improved and the output power can be increased

EXAMPLE 5

A light emitting apparatus was made similarly to Example 1, except for coating the fluorescent substance particles with ethyl silicate to form $SiO_2$ layer on the surface of the fluorescent substance particles before preparing the coating solution. This constitution increased the bonding strength between the fluorescent substance particles, and improved the yield of production higher than that of Example 1.

EXAMPLE 6

A light emitting apparatus was made similarly to Example 1, except for adding alumina as a filler to the adhesive solution in the process of preparing the adhesive solution. With this constitution, since alumina has higher heat conductivity than $SiO_2$, heat dissipation performance was improved over the light emitting apparatus of Example 1.

EXAMPLE 7

In this example, the light emitting apparatus shown in FIG. 3 is fabricated. Description of process steps similar to those of Example 1 will be omitted.

(1) Fabrication of Package

A package 114 for the LED chip was made of polycarbonate resin by insert molding. An opening for disposing the LED chip is provided in the package 114. Copper plate plated with silver is disposed in the package 114 as an external electrode.

(2) Die Bonding

The LED chip is die-bonded onto the package using an inorganic material that is an oxide containing at least one element selected from the group consisting of Si, Al, Ga, Ti, Ge, P, B, Zr, Y and alkali earth metals similarly to Example 1.

(3) Wire Bonding

The electrodes provided on the LED chip 101 and the positive and negative lead electrodes 102 are wire-bonded by means of gold wires. At this time, the electrode surface of the LED chip 101 is heated to about 180° C.

(4) Fabrication of Fluorescent Substance-bound Coating Layer

Then the coating layer wherein the fluorescent substance is bound with oxide containing at least one element selected from the group consisting of Si, Al, Ga, Ti, Ge, P, B, Zr, Y and alkali earth metals is formed. In this example, the fluorescent substance is bound with $SiO_2$ that is commonly used, and the coating layer wherein the fluorescent substance is bound with $SiO_2$ is formed on the surface of the light emitting device and on the supporting body other than the surface of the light emitting device.

The coating layer wherein the fluorescent substance is bound with $SiO_2$ is formed from the coating solution prepared by dispersing the fluorescent substance (powder) uniformly in silica sol made by mixing an alkyl silicate and an organic solvent having high boiling point in predetermined proportion, by spraying the coating solution so as to cover the entire surface of the light emitting device that has been wire-bonded after die-bonding in the package, and heating the $SiO_2$ component.

Spray coating of the coating solution can be done similarly to Example 1. As shown in FIG. 3, the coating solution and gas are sprayed repetitively onto the top surface, side faces and corners of the light emitting device until the film reaches a predetermined thickness. The predetermined thickness refers to such a thickness of the coating layer as light emitted by the LED undergoes sufficient wavelength conversion by the fluorescent substance contained in the coating layer and light transmissivity is not decreased by the fluorescent substance particles. By employing the spray coating method, the top surface, side faces and corners of the light emitting device can be covered with the coating layer wherein the fluorescent substance is bound with $SiO_2$ with substantially uniform thickness, while the fluorescent substance is uniformly dispersed therein.

(5) Sealing

The recess of the package 114 is filled with a molding resin so as to seal the LED 101 and the wire 104.

The light emitting apparatus that is made as described above can emit blended light of white color when supplied with electric power. The light emitting apparatus of the present invention showed efficiency of light emission of 24.0 lm/W.

EXAMPLE 8

A nitride semiconductor light emitting device of this example will be described below with reference to the accompanying drawings. The light emitting device of this example is constituted from a support substrate, a junction layer that is formed on one principal surface of the support substrate and has a eutectic layer, a p-type nitride semiconductor layer consisting of one or more layer formed on the junction layer, an active layer formed on the p-type nitride semiconductor layer and an n-type nitride semiconductor layer consisting of one or more layer formed on the active layer.

FIG. 6 is a schematic sectional view showing an example of manufacturing process according to the method of manufacturing the nitride semiconductor light emitting device of this example. A base layer 2 comprising a buffer layer 3 and a high-temperature grown layer 4 is formed on the surface of a growth substrate 1 (FIG. 6A). Then an n-type cladding layer 5, an active layer 6, a p-type cladding layer 7, a p-type contact layer 8 and a first junction layer 9 comprising one or more metal layer are formed on the base layer 2 (FIG. 6B). In the first junction layer 9, after forming a p electrode on the p-type contact layer 8, annealing is applied so as to form ohmic contact. A support substrate 10 having a second junction layer 11 comprising one or more metal layer formed thereon is stacked on the growth substrate 1 so that the first junction layer 9 and the second junction layer 11 oppose each other, and bonded by thermo-compression bonding process (FIG. 6C).

Figure 6A:
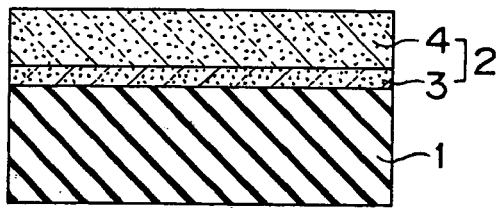
FIGS. 6A to 6E are sectional views showing a process of manufacturing the light emitting device having a semiconductor layer formed on a support substrate (metal substrate).
Figure 6B:
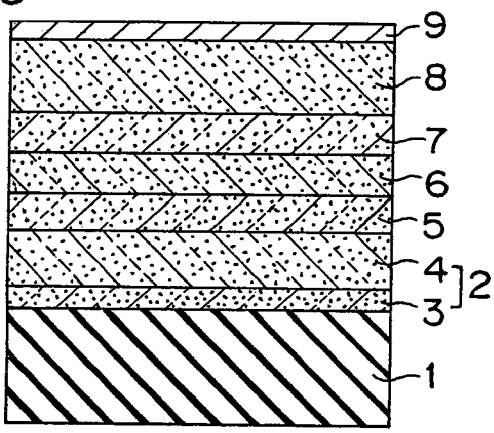
Figure 6C:
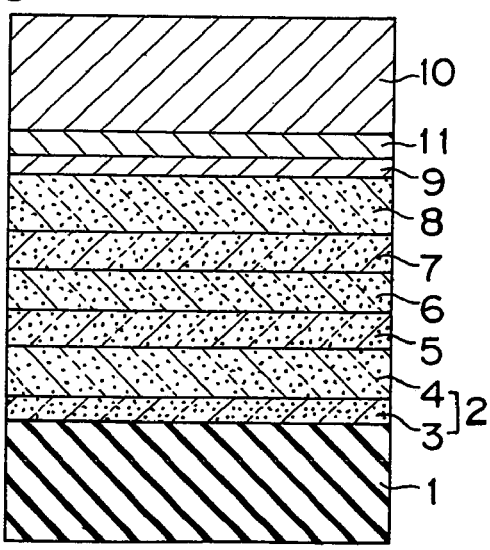
Figure 6D:
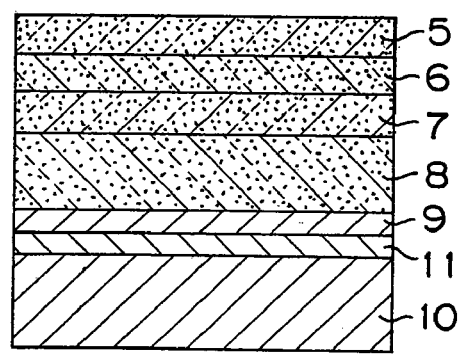

The growth substrate 1 that has been bonded with the support substrate 10 is placed on a polisher and is lapped so as to remove the growth substrate 1 and the base layer 2, thereby exposing the n-type cladding layer 5 (FIG. 6D).

Figure 6E:
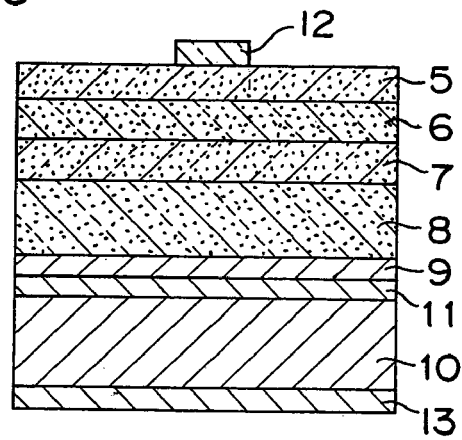

After polishing the surface of the n-type cladding layer 5 that has been exposed, an n-type electrode 12 is formed on the n-type cladding layer 5, and a pad electrode 13 for the p-electrode is formed all over the support substrate 10. Then light emitting device chips are divided by dicing. This completes the light emitting devices comprising nitride semiconductor layers formed on the support substrate with the electrodes formed on the support substrate (FIG. 6E).

According to the method of this example, while the growth substrate may be made of sapphire, spinel (insulating material such as $MgAl_2O_4$) or an oxide that is lattice-matched with the nitride semiconductor having the principal plane in C, R or A plane, sapphire or spinel is preferably used. The growth substrate is preferably an off-angle substrate. Use of an off-angle substrate made in stepwise configuration improves the crystallinity of the base layer made of nitride gallium.

When forming the nitride semiconductor layers on the growth substrate 1, nitride semiconductor layer of better crystallinity can be formed by growing on the base layer by ELO (Epitaxially Lateral Overgrowth) process. Specifically, after growing the base layer on the growth substrate, a plurality of striped masks are formed on the base layer so that nitride semiconductor is selectively grown through the opening of the mask thereby forming the nitride semiconductor layers (laterally grown layers) that is grown while being accompanied by lateral growth. Since occurrence of threading dislocation is reduced in the laterally grown layers, crystallinity of the nitride semiconductor formed on the laterally grown layer can be improved.

The growth substrate 1 preferably has the principal plane of the material formed in off-angle direction, and is more preferably an off-angle substrate made in stepwise configuration. Use of the off-angle substrate makes it easy to achieve a flat surface through stepwise growth without 3-dimentional growth taking place on the surface.

The support substrate 10 may be made of one or more kind of metal selected from high-conductivity metals containing Ag, Cu, Au and Pt and one or more kind of metal selected from high-hardness metals containing W, Mo, Cr and Ni. By making the support substrate 10 from electrically conductive material, electrical continuity of the light emitting device is established through the support substrate. In order to improve the heat dissipation, the support substrate 10 is preferably made of a composite material of Cu—W or Cu—Mo. This is because the use of Cu having high heat conductivity improves the heat dissipating performance. The support substrate 10 may also be made of a semiconductor such as Si or SiC or a composite material of metal and ceramics such as Cu-diamond. Thickness of the support substrate 10 is preferably in a range from 50 to 500 μm in order to improve the heat dissipation performance.

It is preferable that the first junction layer 9 makes ohmic contact at least with the p-type nitride semiconductor layer and has the p electrode having high reflectivity in contact with the p-type nitride semiconductor layer. The p electrode may be made of one selected from Rh, Ag, Ni—Au, Ni—Au—RhO and Rh—Ir, and preferably Rh is used. The p electrode is formed on the p-type nitride semiconductor layer having higher resistivity than the n-type nitride semiconductor layer, and is therefore preferably formed over substantially the entire surface of the p-type nitride semiconductor layer. Thickness of the p electrode is preferably in a range from 0.05 to 0.5 μm.

It is preferable to form an insulating protective film on the exposed surface of the p-type nitride semiconductor layer having the p electrode of the first junction layer 9 formed thereon. The protective film may be a single-layer film or a multi-layer film made of $SiO_2$, $Al_2O_3$, $ZrO_2$, $TiO_2$ or the like. A metal film having high reflectivity such as Al, Ag and Rh may also be formed on the protective film. This metal film improves reflectivity and hence the efficiency of extracting light.

It is also preferable to form a first eutectic forming layer on the p electrode of the first junction layer 9 and form a second eutectic forming layer on the principal surface of the support substrate 10. The first and second eutectic forming layers diffuse into each other when fused, thereby to form a eutectic layer, and are made of metals such as Au, Sn, Pd and In. Preferable combination of the first and second eutectic forming layers is Au—Sn, Sn—Pd or In—Pd. More preferable combination is to use Sn for the first eutectic forming layer and Au for the second eutectic forming layer.

An affinity layer and a barrier layer are preferably provided between the first eutectic forming layer and the p electrode of the first junction layer 9 from the p electrode side. The affinity layer is provided for the purpose of securing very intimate contact with the p electrode, and is preferably made of Ti, Ni, W or Mo. The barrier layer is provided to prevent the metals that constitute the first eutectic forming layer from diffusing into the affinity layer, and is preferably made of Pt or W. In order to prevent the metals that constitute the first eutectic forming layer from diffusing into the affinity layer more reliably, an Au film about 0.3 μm thick may also be formed between the barrier layer and the first eutectic forming layer. The affinity layer, the barrier layer and the Au film are preferably formed between the second eutectic layer and the support substrate.

Thermo-compression bonding of the junction layer and the support substrate 10 is carried out at a temperature from 150 to 350° C. At a temperature not lower than 150° C., it is made possible to promote the diffusion of the metals of the eutectic forming layers so as to form eutectic of uniform density, and improve the intimate contact between the junction layer and the support substrate. When the temperature is higher than 350° C., the metals of the eutectic forming layers diffuse into the barrier layer or further into the affinity layer and intimate contact cannot be achieved.

To remove the growth substrate after bonding the support substrate, polishing, etching, electromagnetic radiation or a combination thereof may be employed. With the electromagnetic radiation, when laser is used, for example, entire surface of the growth substrate where the base layer is not formed is irradiated with laser beam after bonding the support substrate, thereby decomposing the base layer while the growth substrate and the base layer are removed. After removing the growth substrate and the base layer, a desired film is exposed through CMP process of the nitride semiconductor layer on the surface thereof. This enables it to remove a damaged layer or control the thickness and surface roughness of the nitride semiconductor layer.

The electromagnetic irradiation may also be carried out as follows: after forming the base layer from nitride semiconductor on the growth substrate, the base layer is partially etched down to the growth substrate so as to form surface irregularities and a laterally grown layer is formed on the irregular base layer by ELO growth. Then after forming the n-type nitride semiconductor layer, the active layer and the p-type nitride semiconductor layer successively on the laterally grown layer, the support substrate is bonded onto the p-type nitride semiconductor layer. Then the entire surface of the growth substrate where the base layer is not formed is irradiated with laser beam, thereby decomposing the base layer and remove the growth substrate and the base layer. This method enables it to prevent N2 gas, that is generated by the decomposition of the nitride semiconductor when exposed to the electromagnetic irradiation, from filling the space that is formed between the irregular surface and the laterally grown layer thereby breaking the growth substrate by gas pressure, thereby avoiding damage on the base layer due to the crack, so that nitride semiconductor substrate of good surface condition and good crystallinity can be obtained. Since this method can be carried out in a simpler process compared to polishing, the effect of improving the yield of production can also be achieved.

The n electrode formed on the exposed surface of the n-type nitride semiconductor layer may be formed in multilayer structure from Ti—Al—Ni—Au or W—Al—W—Pt—Au. Thickness of the n electrode is preferably from 0.1 to 1.5 μm. It is also preferable that an insulating protective film is formed from $SiO_2$, $Al_2O_3$, $ZrO_2$, $TiO_2$ or the like so as to cover the exposed surface except for the n electrode.

Figure 9:
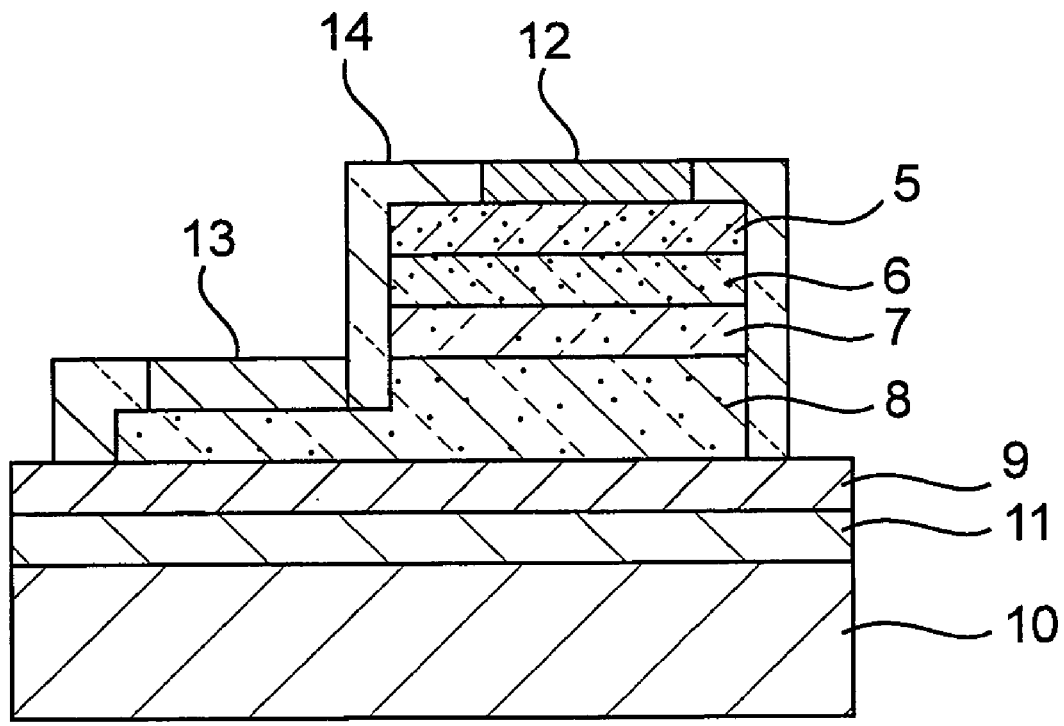
FIG. 9 is a sectional view showing further another example of the structure of the light emitting device having a semiconductor layer formed on a support substrate (metal substrate).

The LED device of this example measures 1 mm×1 mm, and emits blue light of wavelength 460 nm when supplied with forward current of 20 mA. Total thickness of the nitride-based semiconductor layers of the LED device except for the support substrate is from 5 to 10 μm. While this example has such a constitution as the p electrode and the n electrode are disposed at such positions that oppose each other with respect the to the device, the p electrode and the pad electrode 13 for the p electrode may be formed by etching a portion of the stacked layers shown in FIG. 6E down to the p-type contact layer 8 by RIE, thereby making the light emitting device having the p electrode and the n electrode disposed in the same direction as shown in FIG. 9.

Figure 7:
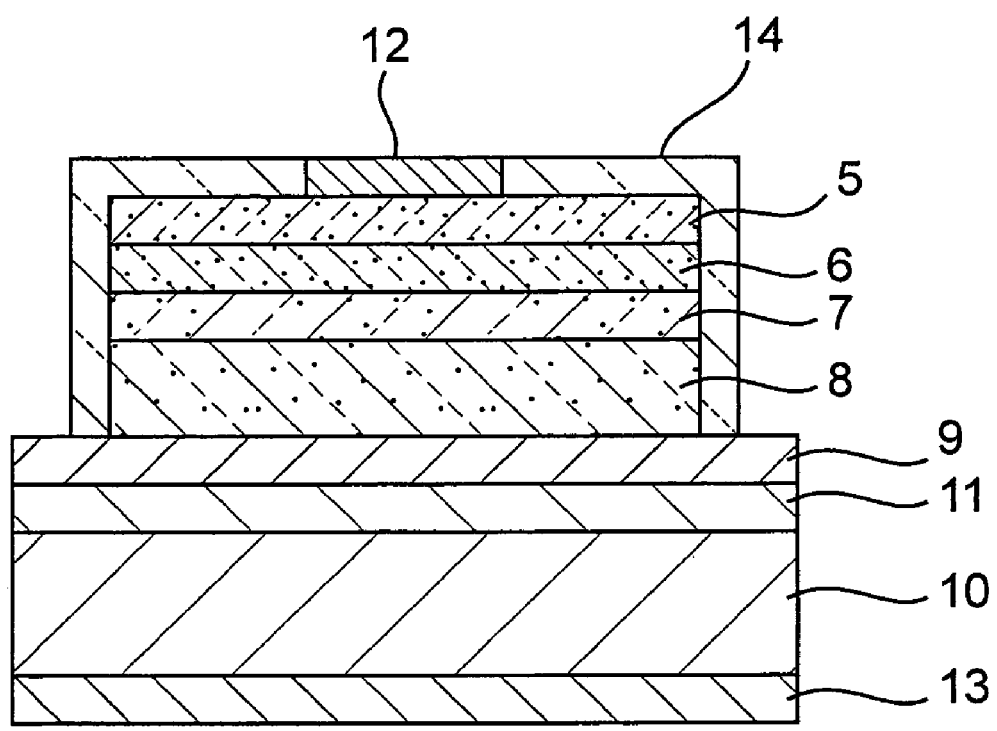
FIG. 7 is a sectional view showing an example of the structure of the light emitting device having a semiconductor layer formed on a support substrate (metal substrate).

Then after placing the LED chip on the metal package 105 and connecting the external electrode 102 and the LED chip with the electrically conductive wire 104, the coating layer 14 as shown in FIG. 7 is formed on the light emitting device that includes the nitride semiconductor by the following method.

① First, a film is formed from resist or polyimide on the electrode of the LED chip. ② Then mixture solution of yttrium aluminum garnet fluorescent substance activated with cerium, the hydrolysate solution of ethyl silicate and a high-boiling point solvent is adjusted and mixed to prepare the coating solution with the fluorescent substance uniformly dispersed therein. ③ The coating solution is applied by the spray coating method described previously to the top surface and the side faces of the LED chip except for the support substrate and the portion where the protective film is formed. ④ A layer about several tens of micrometers thick is formed through primary curing by drying at 150° C. for 30 minutes. ⑤ The layer that has been formed is impregnated with the hydrolysate solution of ethyl silicate that does not contain the fluorescent substance. ⑥ Last, the film made of resist or polyimide is removed and secondary curing is carried out by drying at 240° C. for 30 minutes. By the process from ① to ⑥, the coating layer 14 having substantially uniform thickness of 20 to 30 μm was formed that continued over at least the exposed surface of the nitride semiconductor layers having total thickness of 5 to 10 μm, and is located on the top surface, the side faces and corners of the light emitting device except for the electrode of the LED chip.

According to this example, such a light emitting apparatus can be provided as the light emitting device has the fluorescent substance secured thereon by using an inorganic material that does not deteriorate when used in conjunction with the light emitting device that emits light in a region from blue to ultraviolet, and color of emitted light undergoes less variation when used for a long period of time. Moreover, by forming the coating layer 14 that covers at least the light emitting surface of the light emitting device with substantially uniform thickness, the light emitting apparatus of this example is made capable of emitting light with less variation in color temperature when viewed in different directions. Also because the coating layer that contains the fluorescent substance is formed over all surfaces of the light emitting device through which the light is seen and the light does not transmit through the support substrate, the efficiency of extracting light that has undergone wavelength conversion by the fluorescent substance is improved in comparison to the light emitting device that employs sapphire substrate of the prior art. The use of support substrate having higher heat conductivity also improved the heat dissipation performance in comparison to the light emitting device that employs sapphire substrate of the prior art.

EXAMPLE 9

After exposing the side faces of the p-type ad n-type semiconductor layers formed on the support substrate by etching as shown in FIG. 7, a coating solution prepared similarly to that described in Example 8, or a material made by mixing yttrium aluminum garnet fluorescent substance activated with cerium in silicone resin was applied by screen printing thereby to form the coating layer. In case the material made of silicone resin containing the fluorescent substance was used, it was cured at 150° C. for one hour. The semiconductor wafer made as described above was scribed and divided by dicing into LED chips.

By forming the coating layer 14 containing the fluorescent substance on the wafer, it is made possible to inspect and classify the LED chip for the color of emitted light before the stage of mounting the LED chip on the metal package to made the light emitting apparatus, namely in the stage of LED chip just after the coating layer containing the fluorescent substance has been formed thereon. Consequently, yield of production of the light emitting apparatus is improved. Thus the LED chip having the coating layer 14 formed thereon of this example is made capable of emitting light with less variation in color temperature when viewed in different directions.

EXAMPLE 10

Figure 8:
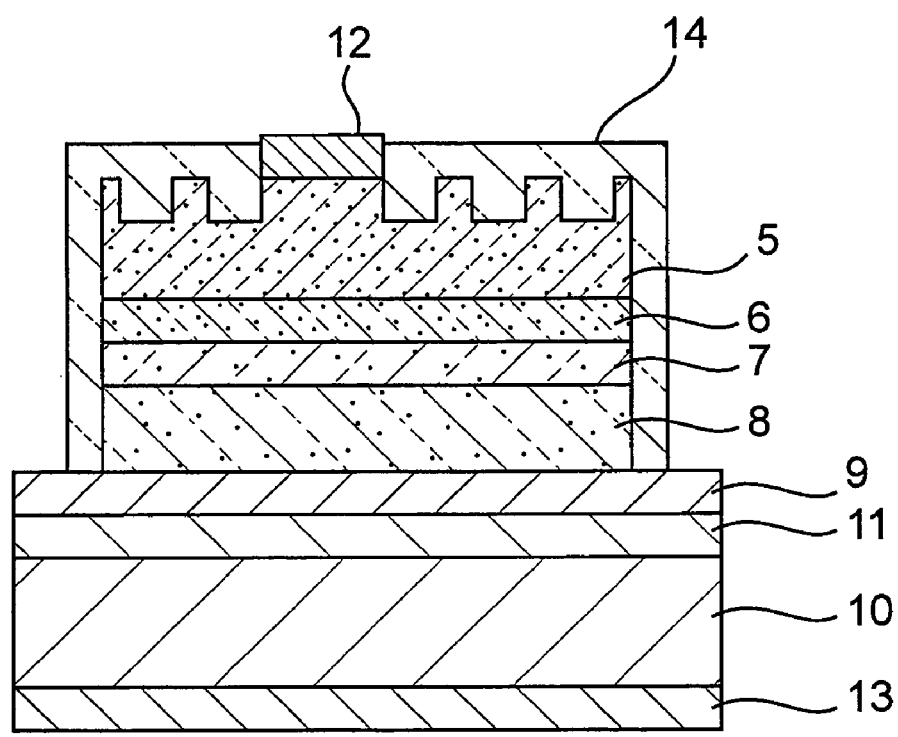
FIG. 8 is a sectional view showing another example of the structure of the light emitting device having a semiconductor layer formed on a support substrate (metal substrate).

FIG. 8 is a schematic sectional view showing the semiconductor light emitting device of this example.

In order to improve the efficiency of extracting light after removing the growth substrate, surface irregularities are formed (dimple processing) by RIE on the exposed surface of the n-type nitride semiconductor layer and/or the side faces of the semiconductor layer. In this example, the dimple processing was applied particularly to the n-type cladding layer 5 as shown in FIG. 8, but dimple processing may also be applied to the layers from the n-type cladding layer 5 to the active layer 6, the p-type cladding layer and the p-type cladding layer. Cross section of the surface irregularity may have such a shape as mesa or inverted mesa, and the planar shape thereof may be a shape of island, grating, rectangle, circle or polygon. The coating solution 14 was formed similarly to Example 8 on the exposed surface whereon the dimple processing was applied and the side faces of the semiconductor layer.

In the process described above, such a light emitting apparatus can be provided that has improved efficiency of extracting light emitted by the light emitting device wherein color of emitted light undergoes less variation when used for a long period of time.

EXAMPLE 11

Nitride semiconductor device was fabricated under conditions similar to those of Example 8, except for disposing a plurality of nitride semiconductor devices in the arrangement of dots on the support substrate. Part of the side faces of the nitride semiconductor device was etched to expose whereon the coating solution 14 is formed similarly to Example 8. Last, the support substrate was mounted on the supporting body such as the metal package, and electrical continuity was established between the pair of positive and negative electrodes of the light emitting device and the external electrodes, thereby completing the light emitting apparatus.

Thus such a light emitting apparatus is made that has a plurality of light emitting devices that can emit light by blending the light emitted by the light emitting devices and the light produced by the fluorescent substance through wavelength conversion of the light emitted by the light emitting devices, and can emit the blended light through a large area. This light emitting apparatus can be used as the light source for illumination.

As described above in detail, the present invention provides the light emitting apparatus than can emit light with less variation in light color even after being used for a long period of time, by employing the light emitting device that emits light including ultraviolet ray and the fluorescent substance bound with the inorganic material that is not deteriorated when exposed to ultraviolet ray.

Moreover, since the coating layer covers the top surface, side faces and the corners of the light emitting surface of the light emitting device with substantially uniform thickness, the light emitting apparatus of the present invention is capable of emitting light with less variation in color tone when viewed in different directions. Also the light emitting apparatus can be manufactured with very high yield.

As the adhesive layer is formed from an inorganic material such as $SiO_2$ and the light emitting device is die-bonded onto the supporting body such as package, the adhesive layer does not experience deterioration and discoloration even when a light emitting device that emits light including wavelength shorter than that of blue light is die-bonded thereto, and are free from deterioration and discoloration upon exposure to high output light and high temperature caused thereby, thus making it possible to make the light emitting apparatus of higher reliability, compared to a light emitting apparatus made by die-bonding with a resin containing organic material of the prior art.

The invention claimed is:

1. A light emitting apparatus comprising:
   a light emitting device disposed on a supporting body; and
   a coating layer comprising a fluorescent substance and covering at least a surface of said light emitting device, said fluorescent substance absorbs at least a portion of light emitted by said light emitting device and emits light of a different wavelength;
   wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
   wherein said coating layer covers the surface of said supporting body and the entire surface of said light emitting device, and the thickness of said coating layer on a top surface, a side face and a corner of said light emitting device and the thickness of said coating layer on a surface of said supporting body are substantially the same.

2. A light emitting apparatus comprising:
   a light emitting device disposed on a supporting body; and
   a coating layer comprising a fluorescent substance and covering at least a surface of said light emitting device, said fluorescent substance absorbs at least a portion of light emitted by said light emitting device and emits light of a different wavelength;
   wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
   wherein said coating layer comprises at least two layers, each layer having a refractive index that is smaller than that of a nitride semiconductor of said light emitting device, and the refractive index of each layer decreases gradually with the distance from said light emitting device.

3. A light emitting apparatus comprising:
   a light emitting device disposed on a supporting body; and
   a coating layer comprising a fluorescent substance and covering at least a surface of said light emitting device, said fluorescent substance absorbs at least a portion of light emitted by said light emitting device and emits light of a different wavelength;
   wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
   wherein said light emitting device is disposed so as to oppose the top surface of said supporting body via an adhesive layer, while the adhesive layer contains the same material as that of said coating layer.

4. The light emitting apparatus according to 3, wherein said adhesive layer contains particles of an oxide and a hydroxide.

5. The light emitting apparatus according to 3, wherein said adhesive layer extends over a side face of said light emitting device.

6. A light emitting apparatus comprising:
a light emitting device disposed on a supporting body; and
a coating layer comprising a fluorescent substance and covering at least a surface of said light emitting device, said fluorescent substance absorbs at least a portion of light emitted by said light emitting device and emits light of a different wavelength;
wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
wherein said light emitting device has an emission peak at a wavelength from 250 nm to 530 nm, and an emission wavelength of said fluorescent substance is longer than a wavelength of the main emission peak of said light emitting device.

7. A light emitting apparatus comprising:
a light emitting device disposed on a supporting body; and
a coating layer comprising a fluorescent substance and covering at least a surface of said light emitting device, said fluorescent substance absorbs at least a portion of light emitted by said light emitting device and emits light of a different wavelength;
wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
wherein said fluorescent substance is yttrium aluminum garnet-containing fluorescent substance that includes: Y; Al; at least one element selected from the group consisting of Lu, Sc, La, Gd, Tb, Eu and Sm; and at least one element selected from the group consisting of Ga and In,
and said fluorescent substance is activated with a rare earth element.

8. A light emitting apparatus comprising:
a light emitting device disposed on a supporting body; and
a coating layer comprising a fluorescent substance and covering at least a surface of said light emitting device, said fluorescent substance absorbs at least a portion of light emitted by said light emitting device and emits light of a different wavelength;
wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
wherein said fluorescent substance includes: N; at least one element selected from the group consisting of Be, Mg, Ca, Sr, Ba and Zn; at least one element selected from the group consisting of C, Si, Ge, Sn, Ti, Zr and Hf; and a nitride-containing fluorescent substance activated with a rare earth element.

9. A light emitting apparatus comprising: a supporting body; an adhesive layer, and a light emitting device comprising a gallium nitride-containing compound semiconductor layer, said light emitting device being disposed on said supporting substrate via the adhesive layer;
wherein said adhesive layer comprises an oxide containing at least one element selected from the group consisting of Si, Al, Ga, Ti, Ge, P, B, Zr, Y, Sn, Pb and alkali earth metals, and a hydroxide containing at least one element selected from the group consisting of Si, Al, Ga, Ti, Ge, P, B, Zr, Y, Sn, Pb and alkali earth metals,
wherein said adhesive layer extends over a side face of the light emitting device.

10. A light emitting apparatus comprising: a supporting body; an adhesive layer, and a light emitting device comprising a gallium nitride-containing compound semiconductor layer, said light emitting device being disposed on said supporting substrate via the adhesive layer;
wherein said adhesive layer comprises an oxide containing at least one element selected from the group consisting of Si, Al, Ga, Ti, Ge, P, B, Zr, Y, Sn, Pb and alkali earth metals, and a hydroxide containing at least one element selected from the group consisting of Si, Al, Ga, Ti, Ge, P, B, Zr, Y, Sn, Pb and alkali earth metals,
wherein said light emitting device has a main emission peak at a wavelength in a range from 250 nm to 530 nm.

11. A light emitting apparatus comprising: a supporting body; an adhesive layer, and a light emitting device comprising a gallium nitride-containing compound semiconductor layer, said light emitting device being disposed on said supporting substrate via the adhesive layer;
wherein said adhesive layer comprises an oxide containing at least one element selected from the group consisting of Si, Al, Ga, Ti, Ge, P, B, Zr, Y, Sn, Pb and alkali earth metals, and a hydroxide containing at least one element selected from the group consisting of Si, Al, Ga, Ti, Ge, P, B, Zr, Y, Sn, Pb and alkali earth metals,
wherein the adhesive layer comprises a filler having a heat conductivity higher than that of said oxide.

12. A light emitting apparatus comprising:
a light emitting device disposed on a supporting body; and
a coating layer comprising a fluorescent substance and covering at least a surface of said light emitting device, said fluorescent substance absorbs at least a portion of light emitted by said light emitting device and emits light of a different wavelength;
wherein said coating layer comprises an oxide including at least one element selected from the group consisting of Si, Al, Ga, Ti, Ge, P, B, Zr, Y, Sn, Pb and alkali earth metals, and a hydroxide including at least one element selected from the group consisting of Si, Al, Ga, Ti, Ge, P, B, Zr, Y, Sn, Pb and alkali earth metals
wherein said light emitting device includes:
a support substrate;
a junction layer that is formed on one principal surface of the support substrate, said junction layer having a eutectic layer; and
stacked layers comprising a p-type nitride semiconductor layer of single-layer or multi-layer structure formed on the junction layer, an active layer formed on the p-type nitride semiconductor layer, and an n-type nitride semiconductor layer of single-layer or multi-layer structure formed on the active layer.

13. The light emitting apparatus according to 12, wherein at least part of a surface of the stacked layers has a concave-convex shape.

* * * * *

UNITED STATES PATENT AND TRADEMARK OFFICE
CERTIFICATE OF CORRECTION

PATENT NO. : 7,301,175 B2 Page 1 of 1
APPLICATION NO. : 10/673273
DATED : November 27, 2007
INVENTOR(S) : Kunihiro Izuno et al.

It is certified that error appears in the above-identified patent and that said Letters Patent is hereby corrected as shown below:

On the front page, please enter the following sections:

(22) PCT Filed: October 11, 2002

(86) PCT No.: PCT/JP2002/10587

§371 (c)(1),
(2), (4) Date: September 30, 2003

(87) PCT Pub. No.: WO 2003/034508
PCT Pub. Date: April 24, 2003

On the front page, under (56) Reference Cited, U.S. PATENT DOCUMENTS, please add:

US2004/0021407 A1*   2/5/2004   Baillie et al.

Signed and Sealed this

Fifth Day of August, 2008

JON W. DUDAS
*Director of the United States Patent and Trademark Office*